United States Patent
Chen et al.

(10) Patent No.: US 12,132,050 B2
(45) Date of Patent: Oct. 29, 2024

(54) SEMICONDUCTOR STRUCTURE CUTTING PROCESS AND STRUCTURES FORMED THEREBY

(71) Applicant: Taiwan Semiconductor Manufacturing Co., Ltd., Hsinchu (TW)

(72) Inventors: Ryan Chia-Jen Chen, Hsinchu (TW); Cheng-Chung Chang, Kaohsiung (TW); Shao-Hua Hsu, Taitung (TW); Yu-Hsien Lin, Kaohsiung (TW); Ming-Ching Chang, Hsinchu (TW); Li-Wei Yin, Hsinchu (TW); Tzu-Wen Pan, Hsinchu (TW); Yi-Chun Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/526,062

(22) Filed: Dec. 1, 2023

(65) Prior Publication Data

US 2024/0113112 A1    Apr. 4, 2024

Related U.S. Application Data

(60) Continuation of application No. 17/818,405, filed on Aug. 9, 2022, now Pat. No. 11,894,370, which is a
(Continued)

(51) Int. Cl.
*H01L 21/3065* (2006.01)
*H01L 21/3213* (2006.01)
(Continued)

(52) U.S. Cl.
CPC ...... *H01L 27/0886* (2013.01); *H01L 21/3065* (2013.01); *H01L 21/32133* (2013.01);
(Continued)

(58) Field of Classification Search
CPC ........... H01L 29/0649; H01L 29/66545; H01L 29/7842; H01L 27/0207; H01L 27/0886;
(Continued)

(56) References Cited

U.S. PATENT DOCUMENTS 8,603,893 B1   12/2013   Wei et al.
8,617,996 B1   12/2013   Chi et al.
(Continued)

FOREIGN PATENT DOCUMENTS

CN        103839822 A    6/2014
CN        104681557 A    6/2015
(Continued)

*Primary Examiner* — Monica D Harrison
(74) *Attorney, Agent, or Firm* — Slater Matsil, LLP

(57) ABSTRACT

Methods of cutting gate structures and fins, and structures formed thereby, are described. In an embodiment, a substrate includes first and second fins and an isolation region. The first and second fins extend longitudinally parallel, with the isolation region disposed therebetween. A gate structure includes a conformal gate dielectric over the first fin and a gate electrode over the conformal gate dielectric. A first insulating fill structure abuts the gate structure and extends vertically from a level of an upper surface of the gate structure to at least a surface of the isolation region. No portion of the conformal gate dielectric extends vertically between the first insulating fill structure and the gate electrode. A second insulating fill structure abuts the first insulating fill structure and an end sidewall of the second fin. The first insulating fill structure is disposed laterally between the gate structure and the second insulating fill structure.

20 Claims, 27 Drawing Sheets

Related U.S. Application Data continuation of application No. 16/205,422, filed on Nov. 30, 2018, now Pat. No. 11,502,076, which is a division of application No. 15/797,626, filed on Oct. 30, 2017, now Pat. No. 10,325,912.

(51) Int. Cl.

| | | |
|---|---|---|
| *H01L 21/762* | (2006.01) | |
| *H01L 21/8234* | (2006.01) | |
| *H01L 27/02* | (2006.01) | |
| *H01L 27/088* | (2006.01) | |
| *H01L 29/06* | (2006.01) | |
| *H01L 29/66* | (2006.01) | |
| *H01L 29/78* | (2006.01) | |
| H01L 21/308 | (2006.01) | |
| H01L 21/3105 | (2006.01) | |
| H01L 21/321 | (2006.01) | |

(52) U.S. Cl.
CPC .. *H01L 21/76224* (2013.01); *H01L 21/76229* (2013.01); *H01L 21/823431* (2013.01); *H01L 21/823437* (2013.01); *H01L 21/823481* (2013.01); *H01L 27/0207* (2013.01); *H01L 29/0649* (2013.01); *H01L 29/66545* (2013.01); *H01L 29/7842* (2013.01); H01L 21/3086 (2013.01); H01L 21/31053 (2013.01); H01L 21/3212 (2013.01)

(58) Field of Classification Search
CPC ........... H01L 21/3065; H01L 21/32133; H01L 21/3212; H01L 21/76224; H01L 21/823431; H01L 21/823437; H01L 21/823481
USPC ........................................................ 257/401
See application file for complete search history.

(56) References Cited

U.S. PATENT DOCUMENTS

| | | | |
|---|---|---|---|
| 8,658,536 B1 | 2/2014 | Choi et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,275,890 B2 | 3/2016 | Wei et al. | |
| 9,362,276 B2 | 6/2016 | Hong | |
| 9,490,341 B2 | 11/2016 | Liou et al. | |
| 9,520,482 B1 | 12/2016 | Chang et al. | |
| 9,548,303 B2 | 1/2017 | Lee et al. | |
| 9,559,014 B1 | 1/2017 | Basker et al. | |
| 9,559,100 B2 | 1/2017 | Chang et al. | |
| 9,564,489 B2 | 2/2017 | Yeo et al. | |
| 9,570,454 B2 | 2/2017 | Liu et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 9,640,659 B2 * | 5/2017 | You ..................... H01L 29/7848 |
| 9,653,583 B1 | 5/2017 | Zhao et al. | |
| 9,704,752 B1 | 7/2017 | Chang et al. | |
| 9,741,717 B1 | 8/2017 | Cheng et al. | |
| 9,773,879 B2 | 9/2017 | Huang et al. | |
| 9,818,836 B1 | 11/2017 | Sung et al. | |
| 9,984,893 B2 | 5/2018 | Cheng et al. | |
| 10,177,145 B2 | 1/2019 | Zhou | |
| 10,177,240 B2 | 1/2019 | Greene et al. | |
| 10,269,802 B2 | 4/2019 | Lin | |
| 11,502,076 B2 | 11/2022 | Chen et al. | |
| 2015/0132901 A1 | 5/2015 | Wang et al. | |
| 2015/0303284 A1 | 10/2015 | Basker et al. | |
| 2015/0318279 A1 | 11/2015 | Hong | |
| 2016/0056292 A1 | 2/2016 | Ho et al. | |
| 2016/0268392 A1 | 9/2016 | Zhu | |
| 2016/0351411 A1 | 12/2016 | Xie et al. | |
| 2017/0084463 A1 | 3/2017 | Greene et al. | |
| 2017/0141106 A1 | 5/2017 | Chang et al. | |
| 2017/0243790 A1 | 8/2017 | Xie et al. | |
| 2018/0261512 A1 | 9/2018 | Greene et al. | |
| 2019/0006345 A1 | 1/2019 | Wang et al. | |
| 2019/0067115 A1 | 2/2019 | Park et al. | |
| 2019/0148244 A1 * | 5/2019 | Ching ..................... H01L 29/16 257/190 |

FOREIGN PATENT DOCUMENTS

| | | |
|---|---|---|
| CN | 105097521 A | 11/2015 |
| CN | 106158854 A | 11/2016 |
| CN | 106952874 A | 7/2017 |
| WO | 2015078104 A1 | 6/2015 |

* cited by examiner

SEMICONDUCTOR STRUCTURE CUTTING PROCESS AND STRUCTURES FORMED THEREBY

PRIORITY CLAIM AND CROSS-REFERENCE

This application is a continuation of U.S. patent application Ser. No. 17/818,405, filed on Aug. 9, 2022, now U.S. Pat. No. 11,894,370, issued Feb. 6, 2024, which is a continuation of U.S. patent application Ser. No. 16/205,422, filed on Nov. 30, 2018, now U.S. Pat. No. 11,502,076 issued Nov. 15, 2022, which is a divisional and claims the benefit of U.S. patent application Ser. No. 15/797,626, filed on Oct. 30, 2017, now U.S. Pat. No. 10,325,912 issued Jun. 18, 2019, each application is hereby incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a Fin Field Effect Transistor (FinFET). FinFET devices typically include semiconductor fins with high aspect ratios and in which channel and source/drain regions are formed. A gate is formed over and along the sides of the fin structure (e.g., wrapping) utilizing the advantage of the increased surface area of the channel to produce faster, more reliable, and better-controlled semiconductor transistor devices. In some devices, strained materials in source/drain regions of the FinFET utilizing, for example, silicon germanium (SiGe), silicon carbide (SiC), and/or silicon phosphide (SiP) may be used to enhance carrier mobility.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
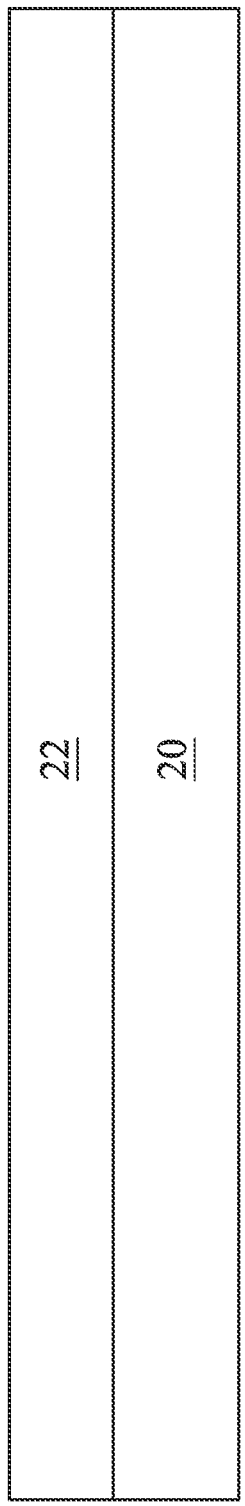
FIGS. 1, 2, 3A-B, 4A-D, 5A-C, 6A-C, 7A-C, 8A-C, 9A-C, ioA-C, nA-C, 12A-C, 13A-C, 14A-C, and 15A-C are various views of respective intermediate structures at intermediate stages in an example process of forming a semiconductor device including one or more FinFETs in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Methods of cutting gate structures and fins in a semiconductor device, such as including Fin Field-Effect Transistors (FinFETs), are described herein. Generally, a fin cut process is performed after a replacement gate structure has been formed and cut. This can, among other benefits, increase a process window for some processes and, in some stress engineering applications, avoid releasing or relaxing stress in a fin.

Example embodiments described herein are described in the context of FinFETs. Implementations of some aspects of the present disclosure may be used in other processes and/or in other devices. Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein.

In some instances in the described embodiments, various losses, e.g., in height, to the illustrated structures may occur during processing. These losses may not be expressly shown in the figures or described herein, but a person having ordinary skill in the art will readily understand how such losses may occur. Such losses may occur as a result of a planarization process such as a chemical mechanical polish (CMP), an etch process when, for example, the structure realizing the loss is not the primary target of the etching, and other processes.

FIGS. 1, 2, 3A-B, 4A-D, and 5A-C through 15A-B are various views of respective intermediate structures during intermediate stages in an example process of forming a semiconductor device including one or more FinFETs in accordance with some embodiments. FIG. 1 illustrates, in a cross-sectional view, a semiconductor substrate 20 with a stressed semiconductor layer 22 formed thereover. The semiconductor substrate 20 may be or include a bulk semiconductor substrate, a semiconductor-on-insulator (SOI) substrate, or the like, which may be doped (e.g., with a p-type or an n-type dopant) or undoped. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the semiconductor substrate layer may include silicon (Si); germanium (Ge); a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or a combination thereof.

The stressed semiconductor layer 22 can have a compressive stress or a tensile stress. In some examples, the stressed semiconductor layer 22 is stressed as a result of heteroepitaxial growth on the semiconductor substrate 20. For example, heteroepitaxial growth generally includes epitaxially growing a grown material having a natural lattice constant that is different from the lattice constant of the substrate material at the surface on which the grown material is epitaxially grown.

Pseudomorphically growing the grown material on the substrate material can result in the grown material having a stress. If the natural lattice constant of the grown material is greater than the lattice constant of the substrate material, the stress in the grown material can be compressive, and if the natural lattice constant of the grown material is less than the lattice constant of the substrate material, the stress in the grown material can be tensile. For example, pseudomorphically growing SiGe on relaxed silicon can result in the SiGe having a compressive stress, and pseudomorphically growing SiC on relaxed silicon can result in the SiC having a compressive stress.

In other examples, the stressed semiconductor layer 22 can be heteroepitaxially grown on a sacrificial substrate and transferred to the semiconductor substrate 20. The stressed semiconductor layer 22 can be pseudomorphically grown on the sacrificial substrate like described above. Then, the stressed semiconductor layer 22 can be bonded (e.g., using wafer bonding) to the semiconductor substrate 20 using appropriate techniques. The sacrificial substrate can then be removed from the stressed semiconductor layer 22, such as by using a separation by implantation of oxide (SIMOX) technique or another removal technique. The stressed semiconductor layer 22, as bonded to the semiconductor substrate 20, can then be polished, such as by a chemical mechanical polish (CMP). By transferring the stressed semiconductor layer 22 like this, there may be more flexibility in choosing materials, stresses, material thicknesses, etc., since the stress of the stressed semiconductor layer 22 does not depend on growth on the semiconductor substrate 20.

The stressed semiconductor layer 22 can be or include silicon, silicon germanium ($Si_xGe_{1-x}$, where x can be between approximately 0 and 1), silicon carbide, pure or substantially pure germanium, a III-V compound semiconductor, a II-VI compound semiconductor, or the like. For example, materials for forming a III-V compound semiconductor include InAs, AlAs, GaAs, InP, GaN, InGaAs, InAlAs, GaSb, AlSb, AlP, GaP, and the like. Further, the stressed semiconductor layer 22 can be epitaxially grown using metal-organic chemical vapor deposition (MOCVD), molecular beam epitaxy (MBE), liquid phase epitaxy (LPE), vapor phase epitaxy (VPE), selective epitaxial growth (SEG), the like, or a combination thereof on the semiconductor substrate 20 or a sacrificial substrate.

Figure 2:
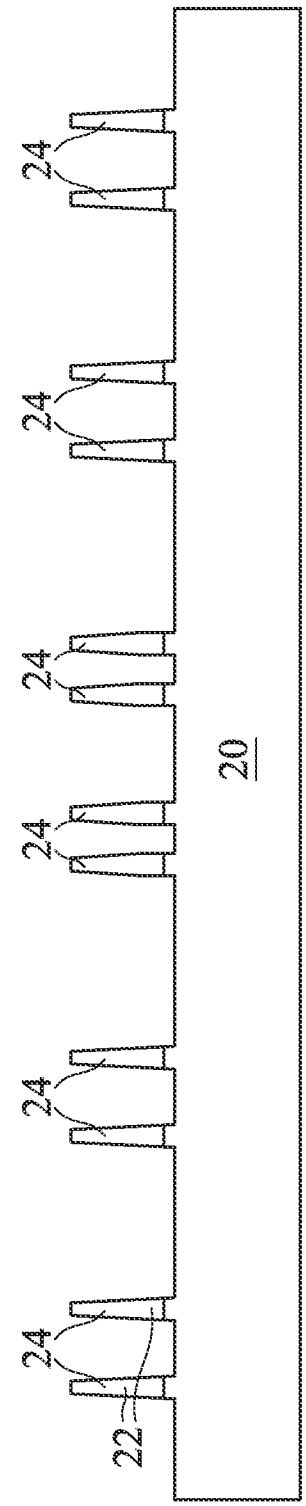

FIG. 2 illustrates, in a cross-sectional view, the formation of fins 24 in the stressed semiconductor layer 22 and/or semiconductor substrate 20. In some examples, a mask (e.g., a hard mask) is used in forming the fins 24. For example, one or more mask layers are deposited over the stressed semiconductor layer 22, and the one or more mask layers are then patterned into the mask. In some examples, the one or more mask layers may include or be silicon nitride, silicon oxynitride, silicon carbide, silicon carbon nitride, the like, or a combination thereof, and may be deposited by chemical vapor deposition (CVD), physical vapor deposition (PVD), atomic layer deposition (ALD), or another deposition technique. The one or more mask layers may be patterned using photolithography. For example, a photo resist can be formed on the one or more mask layers, such as by using spin-on coating, and patterned by exposing the photo resist to light using an appropriate photomask. Exposed or unexposed portions of the photo resist may then be removed depending on whether a positive or negative resist is used. The pattern of the photo resist may then be transferred to the one or more mask layers, such as by using a suitable etch process, which forms the mask. The etch process may include a reactive ion etch (RIE), neutral beam etch (NBE), inductive coupled plasma (ICP) etch, the like, or a combination thereof. The etching may be anisotropic. Subsequently, the photo resist is removed in an ashing or wet strip processes, for example.

Using the mask, the stressed semiconductor layer 22 and/or semiconductor substrate 20 may be etched such that trenches are formed between neighboring pairs of fins 24 and such that the fins 24 protrude from the semiconductor substrate 20. The etch process may include a RIE, NBE, ICP etch, the like, or a combination thereof. The etching may be anisotropic.

Although examples described herein are in the context of stress engineering for the fins 24 (e.g., the fins 24 include respective portions of the stressed semiconductor layer 22), other examples may not implement such stress engineering. For example, the fins 24 may be formed from a bulk semiconductor substrate (e.g., semiconductor substrate 20) without a stressed semiconductor layer. Also, the stressed semiconductor layer 22 may be omitted from subsequent figures; this is for clarity of the figures. In some embodiments where such a stress semiconductor layer is implemented for stress engineering, the stressed semiconductor layer 22 may be present as part of the fins 24 even if not explicitly illustrated; and in some embodiments where such a stress semiconductor layer is not implemented for stress engineering, the fins 24 may be formed from the semiconductor substrate 20.

Figure 3A:
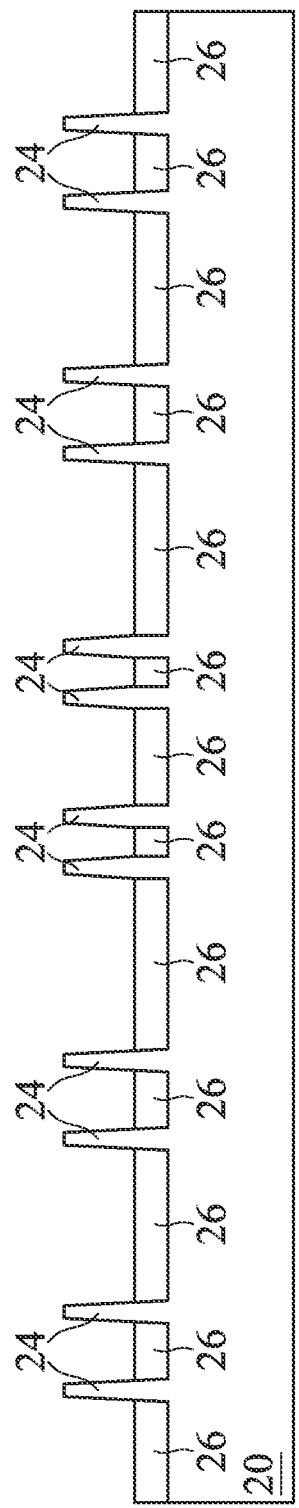
Figure 3B:
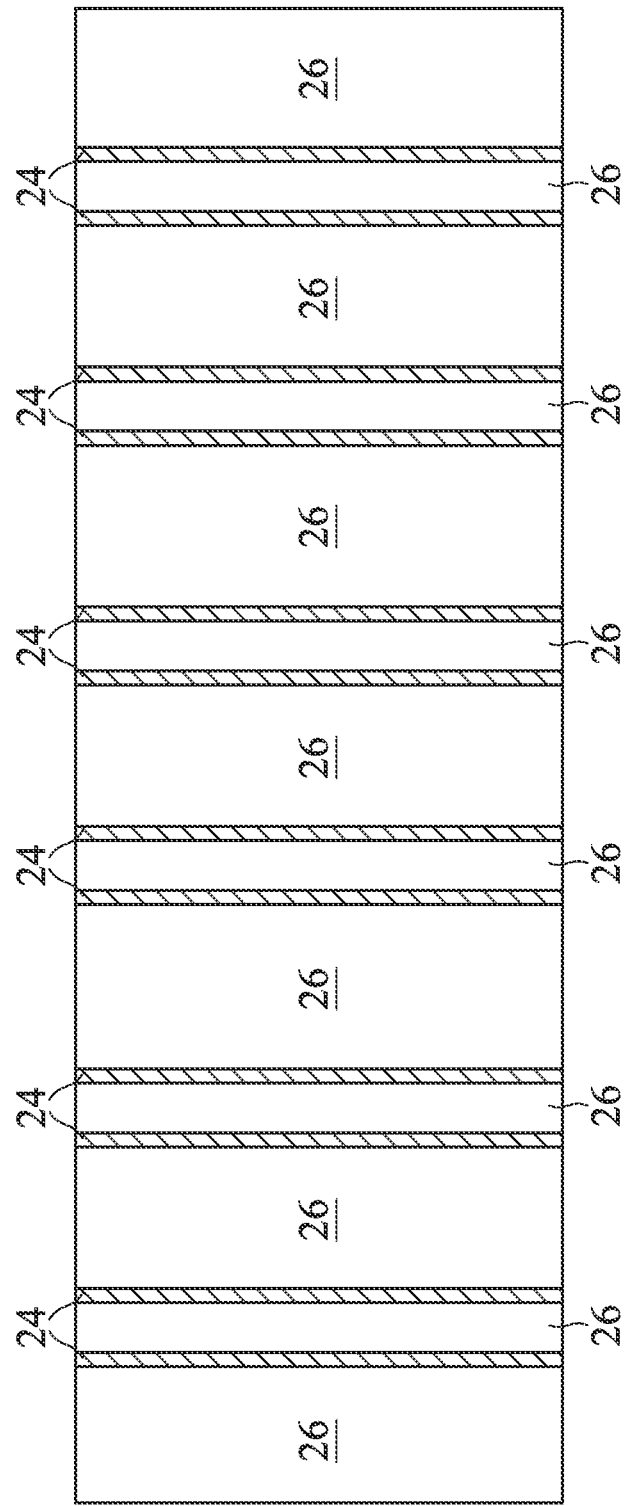

FIGS. 3A and 3B illustrate, in a cross-sectional view and top view, respectively, the formation of isolation regions 26, each in a corresponding trench. The isolation regions 26 may include or be an insulating material such as an oxide (such as silicon oxide), a nitride, the like, or a combination thereof, and the insulating material may be formed by a high density plasma CVD (HDP-CVD), a flowable CVD (FCVD) (e.g., a CVD-based material deposition in a remote plasma system and post curing to make it convert to another material, such as an oxide), the like, or a combination thereof. Other insulating materials formed by any acceptable process may be used. In the illustrated embodiment, the isolation regions 26 include silicon oxide that is formed by a FCVD process. A planarization process, such as a CMP, may remove any excess insulating material and any remaining mask (e.g., used to etch the trenches and form the fins 24) to form top surfaces of the insulating material and top surfaces of the fins 24 to be coplanar. The insulating material may then be recessed to form the isolation regions 26. The insulating material is recessed such that the fins 24 protrude from between neighboring isolation regions 26, which may, at least in part, thereby delineate the fins 24 as active areas on the semiconductor substrate 20. The insulating material may be recessed using an acceptable etching process, such as one that is selective to the material of the insulating material. For example, a chemical oxide removal using a CERTAS® etch or an Applied Materials SICONI tool or dilute hydrofluoric (dHF) acid may be used. Further, top surfaces of the isolation regions 26 may have a flat surface as illustrated, a convex surface, a concave surface (such as dishing), or a combination thereof, which may result from an etch process. As illustrated in the top view of FIG. 3B, the fins 24 extend longitudinally across the semiconductor substrate 20.

A person having ordinary skill in the art will readily understand that the processes described with respect to FIGS. 1 through 3A-B are just examples of how fins 24 may be formed. In other embodiments, a dielectric layer can be formed over a top surface of the semiconductor substrate 20; trenches can be etched through the dielectric layer; homoepitaxial structures can be epitaxially grown in the trenches (e.g., without stress engineering); and the dielectric layer can be recessed such that the homoepitaxial structures protrude from the dielectric layer to form fins. In still other embodiments, heteroepitaxial structures can be used for the fins. For example, the fins 24 can be recessed (e.g., after planarizing the insulating material of the isolation regions 26 and before recessing the insulating material), and a material different from the fins may be epitaxially grown in their place. In an even further embodiment, a dielectric layer can be formed over a top surface of the semiconductor substrate 20; trenches can be etched through the dielectric layer; heteroepitaxial structures can be epitaxially grown in the trenches using a material different from the semiconductor substrate 20 (e.g., with stress engineering); and the dielectric layer can be recessed such that the heteroepitaxial structures protrude from the dielectric layer to form fins. In some embodiments where homoepitaxial or heteroepitaxial structures are epitaxially grown, the grown materials may be in situ doped during growth, which may obviate prior implanting of the fins although in situ and implantation doping may be used together. Still further, it may be advantageous to epitaxially grow a material for an n-type device different from the material in for a p-type device.

Figure 4A:
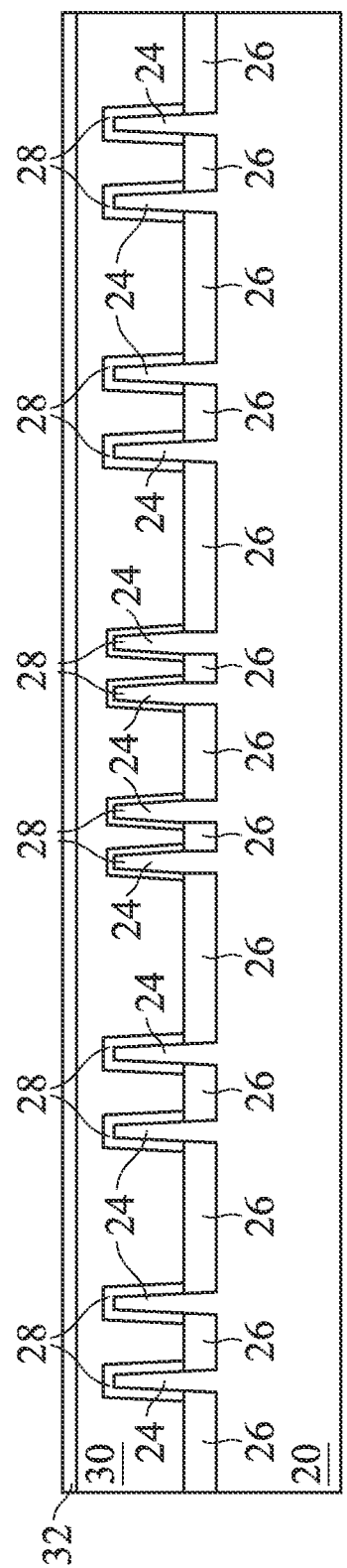
Figure 4B:
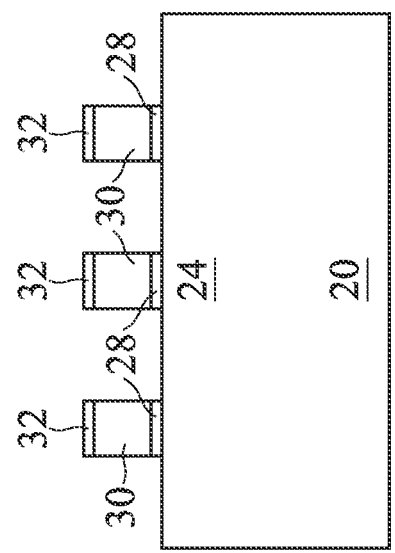
Figure 4C:
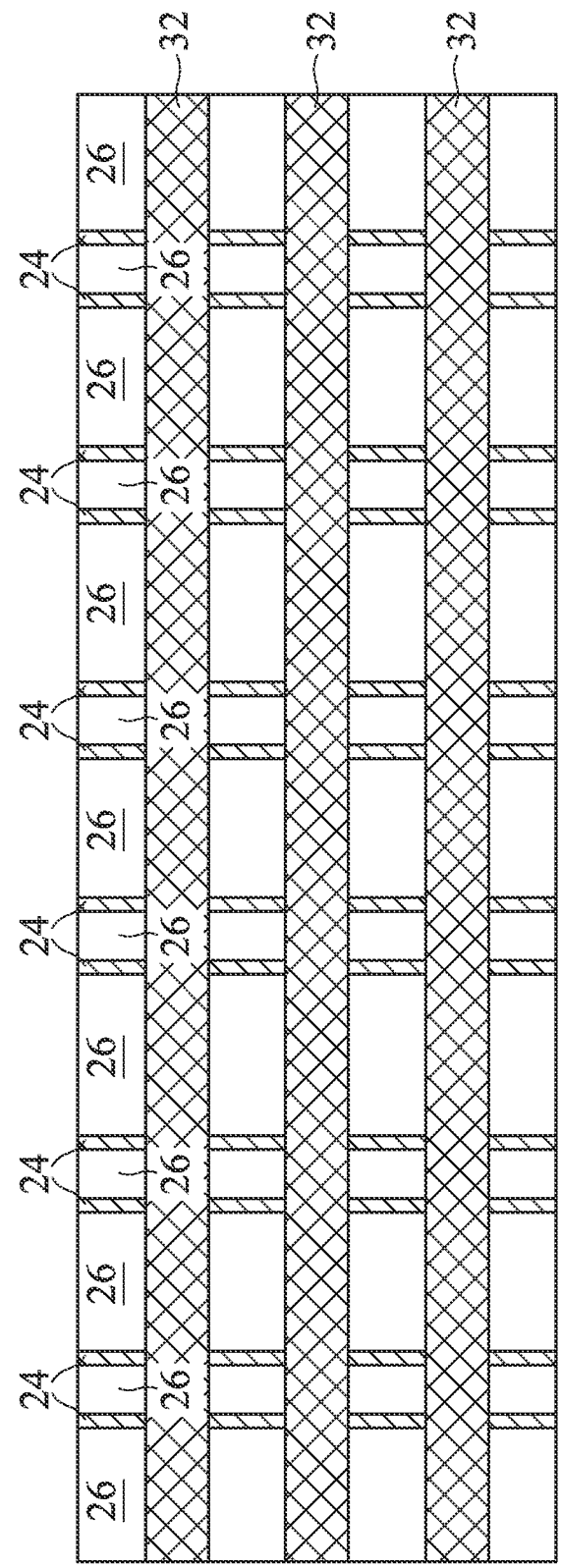
Figure 4D:
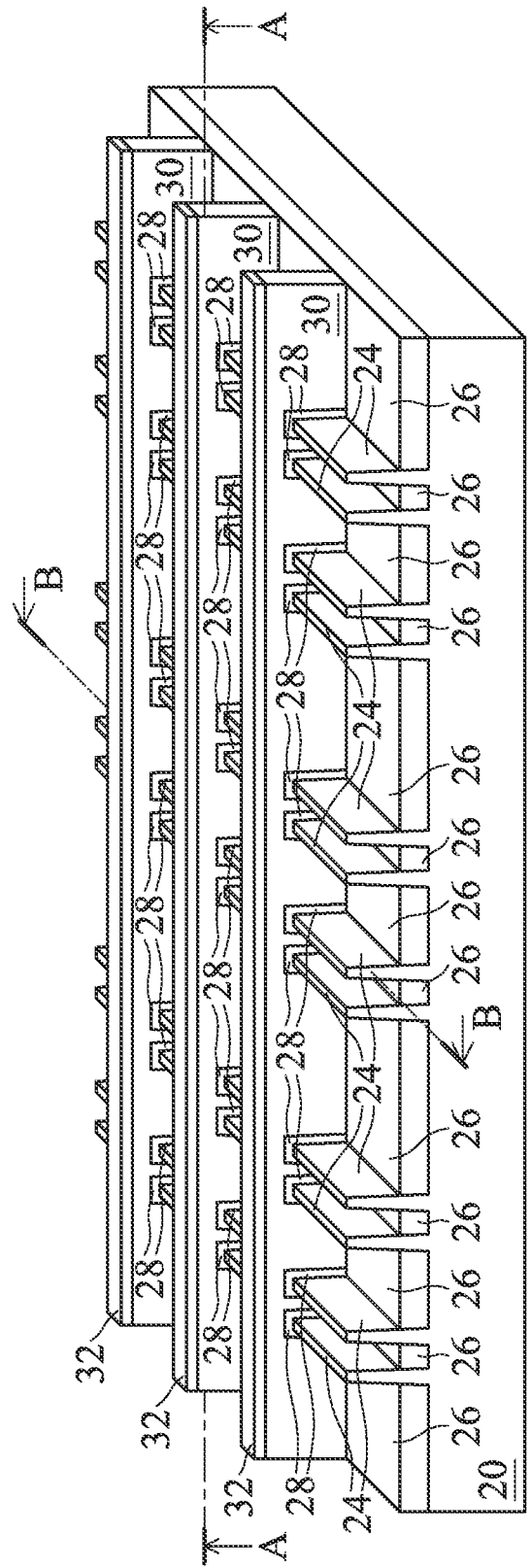

FIGS. 4A, 4B, 4C and 4D illustrate the formation of dummy gate stacks on the fins 24. FIGS. 4A and 4B illustrate cross-sectional views; FIG. 4C illustrates a top view; and FIG. 4D illustrates a three-dimensional view. FIG. 4D illustrates cross-sections A-A and B-B. FIGS. 1, 2, 3A, 4A, and the following figures ending with an "A" designation illustrate cross-sectional views at various instances of processing corresponding to cross-section A-A, and FIG. 4B and the following figures ending with a "B" designation illustrate cross-sectional views at various instances of processing corresponding to cross-section B-B. In some figures, some reference numbers of components or features illustrated therein may be omitted to avoid obscuring other components or features; this is for ease of depicting the figures.

The dummy gate stacks are over and extend laterally perpendicularly to the fins 24. Each dummy gate stack comprises one or more interfacial dielectrics 28, a dummy gate 30, and a mask 32. The one or more interfacial dielectrics 28, dummy gates 30, and mask 32 for the dummy gate stacks may be formed by sequentially forming respective layers, and then patterning those layers into the dummy gate stacks. For example, a layer for the one or more interfacial dielectrics 28 may include or be silicon oxide, silicon nitride, the like, or multilayers thereof, and may be thermally and/or chemically grown on the fins 24, as illustrated, or conformally deposited, such as by plasma-enhanced CVD (PECVD), ALD, or another deposition technique. A layer for the dummy gates 30 may include or be silicon (e.g., polysilicon) or another material deposited by CVD, PVD, or another deposition technique. A layer for the mask 32 may include or be silicon nitride, silicon oxynitride, silicon carbon nitride, the like, or a combination thereof, deposited by CVD, PVD, ALD, or another deposition technique. The layers for the mask 32, dummy gates 30, and one or more interfacial dielectrics 28 may then be patterned, for example, using photolithography and one or more etch processes, like described above, to form the mask 32, dummy gate 30, and one or more interfacial dielectrics 28 for each dummy gate stack.

The cross-section A-A is along a gate stack through which a cut will be made in subsequent figures and description. The cross-section B-B is along a fin 24 (e.g., along a channel direction in the fin 24) through which a cut will be made in subsequent figures and description. Cross-sections A-A and B-B are perpendicular to each other.

Figure 5A:
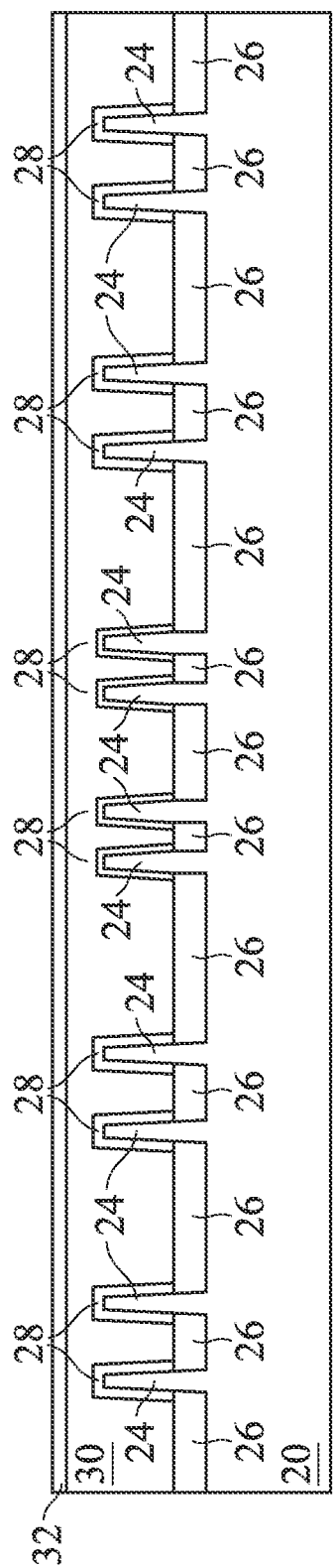
Figure 5B:
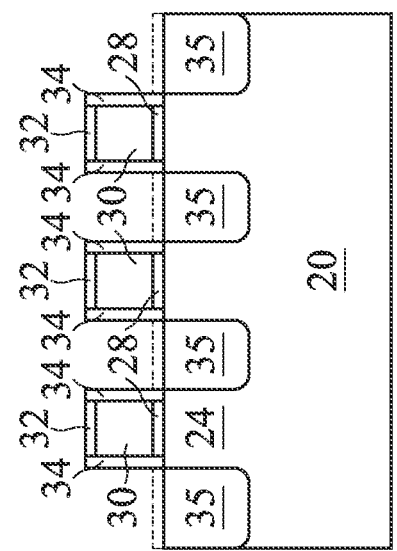
Figure 5C:
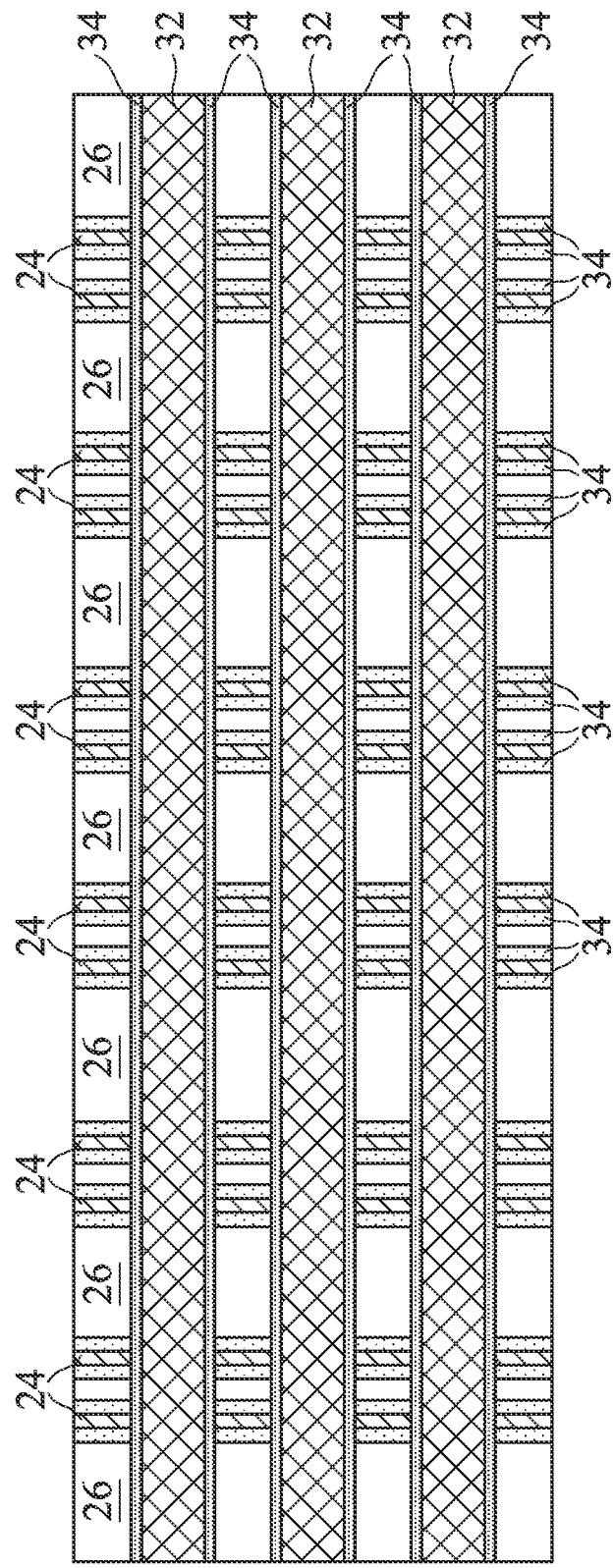

FIGS. 5A, 5B, and 5C illustrate the formation of gate spacers 34. Gate spacers 34 are formed along sidewalls of the dummy gate stacks (e.g., sidewalls of the one or more interfacial dielectrics 28, dummy gate 30, and mask 32) and over the fins 24. Additionally, residual gate spacers 34 may be formed along exposed sidewalls of the fins 24, as illustrated in the figures. The gate spacers 34 may be formed by conformally depositing one or more layers for the gate spacers 34 and anisotropically etching the one or more layers, for example. The one or more layers for the gate spacers 34 may include or be silicon nitride, silicon oxynitride, silicon carbon nitride, the like, multi-layers thereof, or a combination thereof, and the etch process can include a RIE, NBE, or another etching process.

Source/drain regions 35 are formed in the fins 24. In some examples, the source/drain regions 35 are formed by implanting dopants into the fins 24 using the dummy gate stacks and gate spacers 34 as masks. Hence, source/drain regions 35 can be formed by implantation on opposing sides of each dummy gate stack. In other examples, the fins 24 may be recessed using the dummy gate stacks and gate spacers 34 as masks, and epitaxial source/drain regions 35 may be epitaxially grown in the recesses. Epitaxial source/drain regions 35 may be raised in relation to the fin 24, as illustrated by dashed lines in FIG. 5B. The epitaxial source/drain regions 35 may be doped by in situ doping during the epitaxial growth and/or by implantation after the epitaxial growth. Hence, source/drain regions 35 can be formed by epitaxial growth, and possibly with implantation, on opposing sides of each dummy gate stack. Example dopants for source/drain regions 35 can include or be, for example, boron for a p-type device and phosphorus or arsenic for an n-type device, although other dopants may be used. The source/drain regions 35 may have a dopant concentration in a range from about $10^{19}$ cm$^{-3}$ to about 1021 cm$^{-3}$. The source/drain regions 35 are not expressly illustrated in subsequent figures to avoid obscuring other features and components depicted in those figures; however, a person having ordinary skill in the art will readily understand that the source/drain regions 35 are present in the structures depicted in those figures.

Figure 6A:
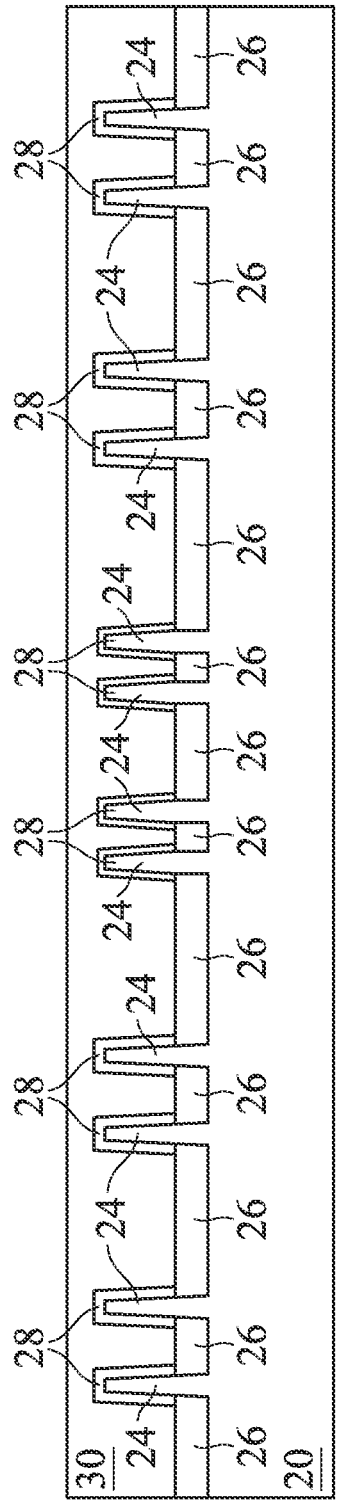
Figure 6B:
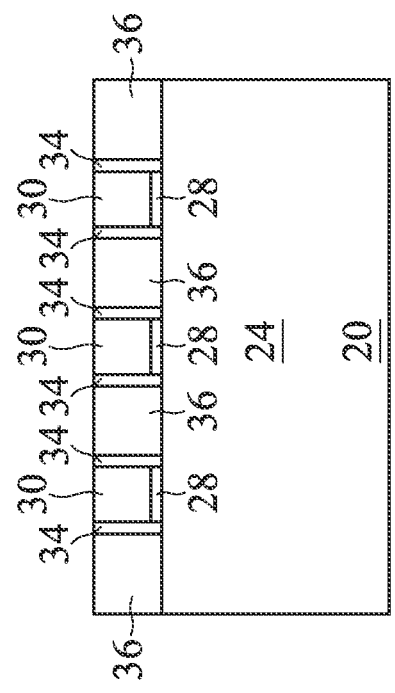
Figure 6C:
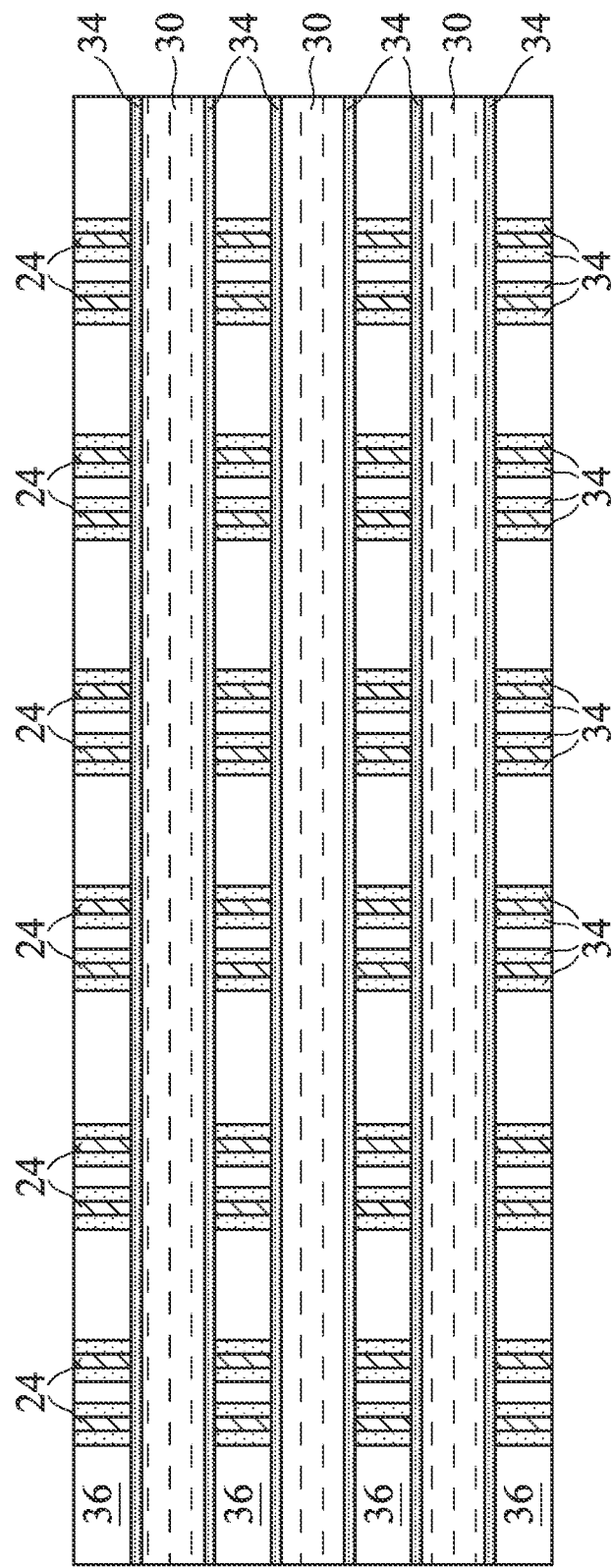

FIGS. 6A, 6B, and 6C illustrate the formation of one or more dielectric layers 36. The one or more dielectric layers 36 may include an etch stop layer (ESL) and an interlayer dielectric (ILD), for example. Generally, an etch stop layer can provide a mechanism to stop an etching process when forming, e.g., contacts or vias. An etch stop layer may be formed of a dielectric material having a different etch selectivity from adjacent layers, for example, the interlayer dielectric. The etch stop layer may be conformally deposited over the fins 24, dummy gate stacks, gate spacers 34, and isolation regions 26. The etch stop layer may comprise or be silicon nitride, silicon carbon nitride, silicon carbon oxide, carbon nitride, the like, or a combination thereof, and may be deposited by CVD, PECVD, ALD, or another deposition technique. The interlayer dielectric may comprise or be silicon dioxide, a low-k dielectric material (e.g., a material having a dielectric constant lower than silicon dioxide), such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof. The interlayer dielectric may be deposited by spin-on, CVD, FCVD, PECVD, PVD, or another deposition technique.

The one or more dielectric layers 36 are formed with top surface(s) coplanar with top surfaces of the dummy gates 30. A planarization process, such as a CMP, may be performed to level the top surface of the one or more dielectric layers 36 with the top surfaces of the dummy gates 30. The CMP may also remove the mask 32 (and, in some instances, upper portions of the gate spacers 34) on the dummy gates 30. Accordingly, top surfaces of the dummy gates 30 are exposed through the one or more dielectric layers 36. It is noted that the dummy gates 30 may experience some loss due to the planarization process.

Figure 7A:
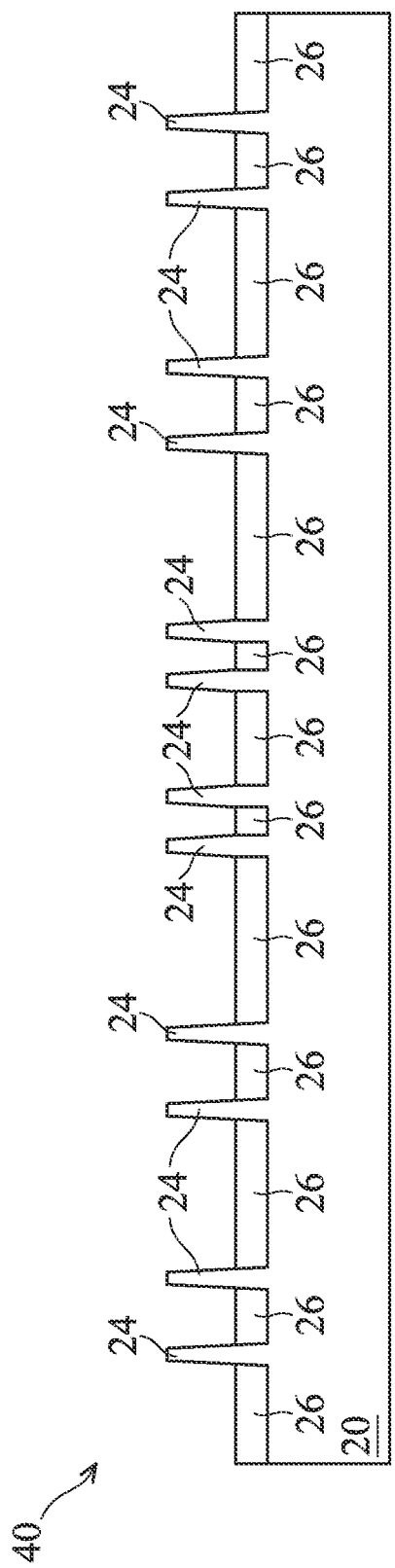
Figure 7B:
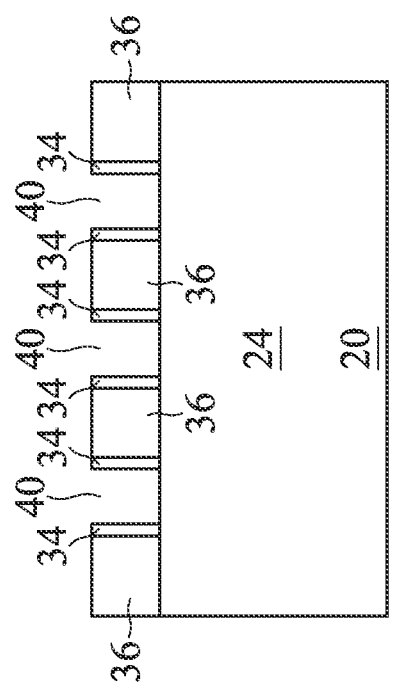
Figure 7C:
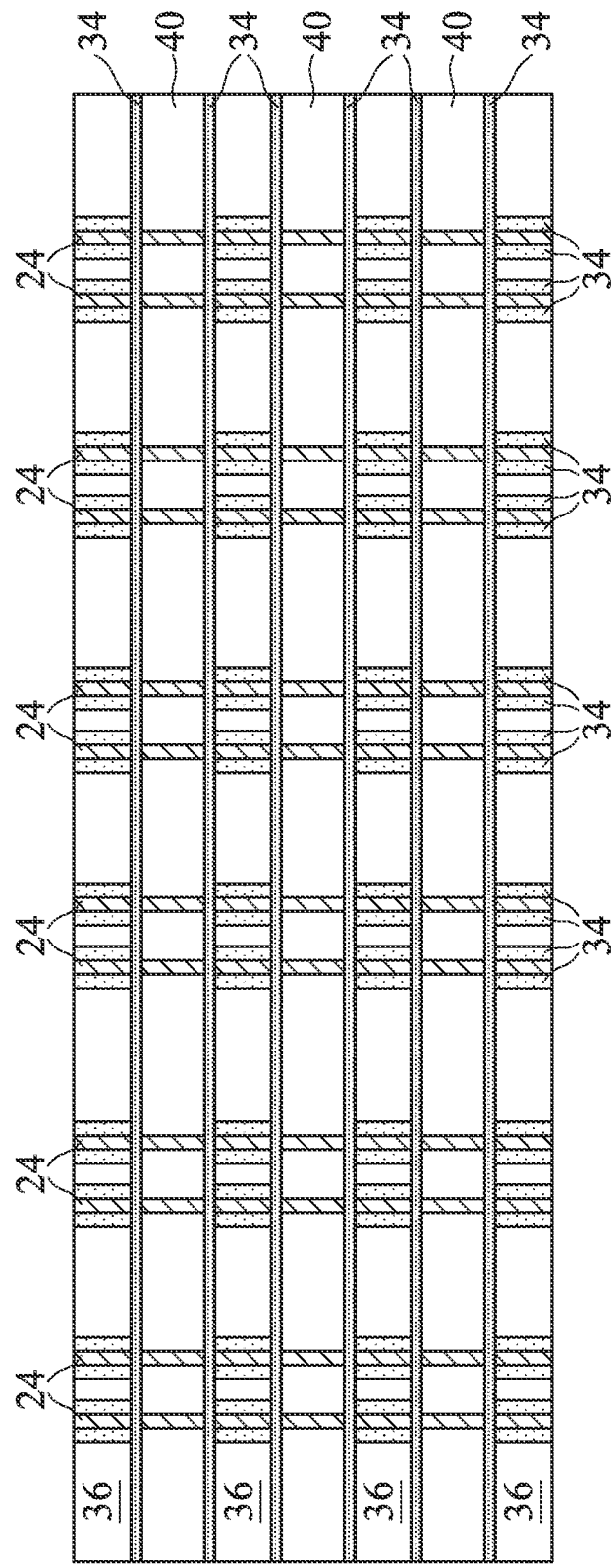

FIGS. 7A, 7B, and 7C illustrate the removal of the dummy gate stacks. The dummy gates 30 and one or more interfacial dielectrics 28 are removed, such as by one or more etch processes. The dummy gates 30 may be removed by an etch process selective to the dummy gates 30, wherein the one or more interfacial dielectrics 28 act as etch stop layers, and subsequently, the one or more interfacial dielectrics 28 can be removed by a different etch process selective to the one or more interfacial dielectrics 28. The etch processes can be, for example, a RIE, NBE, a wet etch, or another etch process. Recesses 40 are formed between gate spacers 34 where the dummy gate stacks are removed, and channel regions of the fins 24 are exposed through the recesses 40.

Figure 8A:
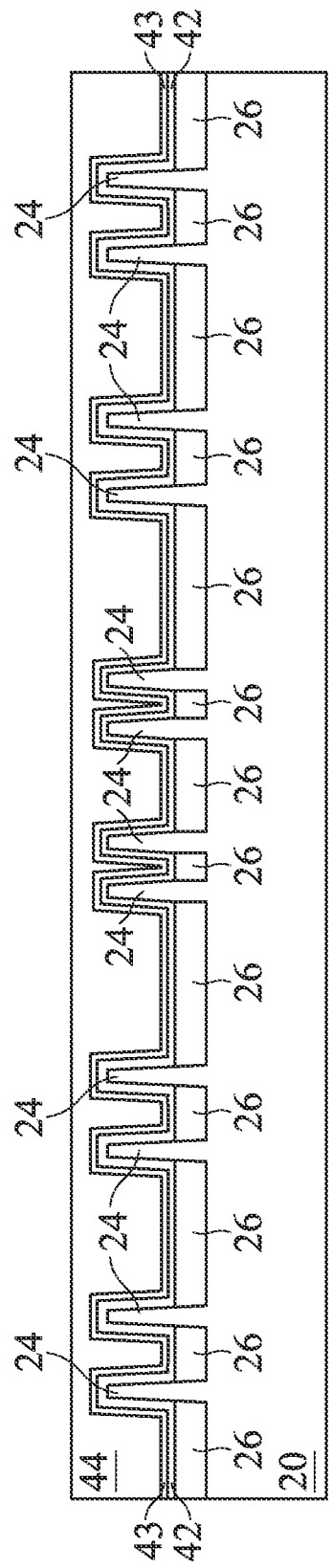
Figure 8B:
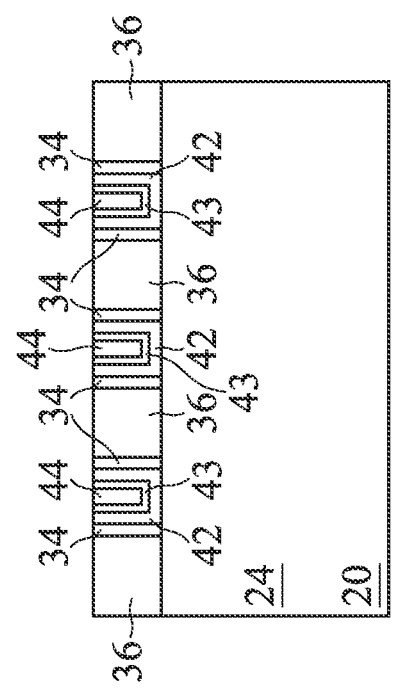
Figure 8C:
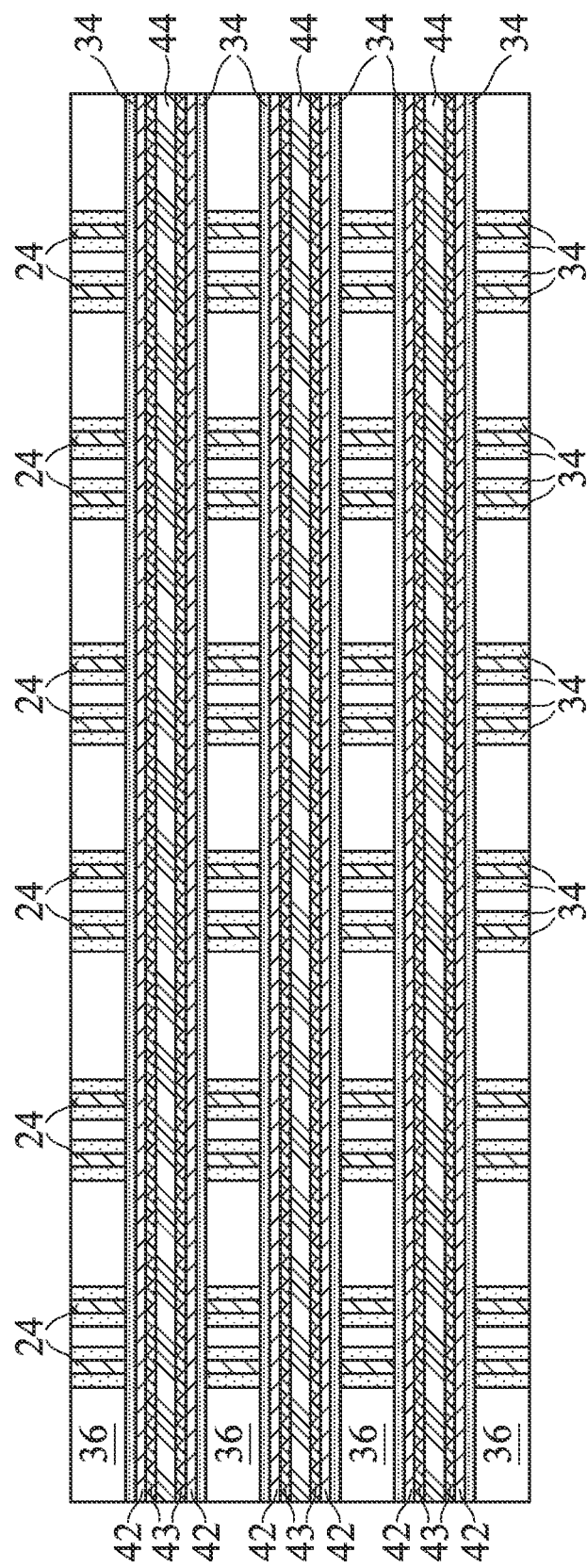

FIGS. 8A, 8B, and 8C illustrate the formation of replacement gate structures in the recesses 40. The replacement gate structures each include conformal layers and a gate electrode 44. The conformal layers include a gate dielectric layer 42 and one or more barrier and/or work-function tuning layers 43.

The gate dielectric layer 42 is conformally deposited in the recesses 40 (e.g., on top surfaces of the isolation regions 26, sidewalls and top surfaces of the fins 24 along the channel regions, and sidewalls and top surfaces of the gate spacers 34) and on the top surface of the one or more dielectric layers 36. The gate dielectric layer 42 can be or include silicon oxide, silicon nitride, a high-k dielectric material, multilayers thereof, or other dielectric material. A high-k dielectric material may have a k value greater than about 7.0, and may include a metal oxide of or a metal silicate of Hf, Al, Zr, La, Mg, Ba, Ti, Pb, or a combination thereof. The gate dielectric layer 42 can be deposited by ALD, PECVD, MBD, or another deposition technique.

Then, a barrier and/or work-function tuning layer 43 is conformally deposited on the gate dielectric layer 42. The barrier and/or work-function tuning layer 43 may include or be tantalum, tantalum nitride, titanium, titanium nitride, the like, or a combination thereof, and may be deposited by ALD, PECVD, MBD, or another deposition technique. Any additional barrier and/or work-function tuning layers may be sequentially deposited similar to the first barrier and/or work-function tuning layer.

A layer for the gate electrodes 44 is formed over the one or more barrier and/or work-function tuning layers 43. The layer for the gate electrodes 44 can fill remaining regions where the dummy gate stacks were removed. The layer for the gate electrodes 44 may be or comprise a metal-containing material such as Co, Ru, Al, W, Cu. multi-layers thereof, or a combination thereof. The layer for the gate electrodes 44 can be deposited by ALD, PECVD, MBD, PVD, or another deposition technique.

Portions of the layer for the gate electrodes 44, one or more barrier and/or work-function tuning layers 43, and gate dielectric layer 42 above the top surface of the one or more dielectric layers 36 are removed. For example, a planarization process, like a CMP, may remove the portions of the layer for the gate electrodes 44, one or more barrier and/or work-function tuning layers 43, and gate dielectric layer 42 above the top surface of the one or more dielectric layers 36. The replacement gate structures comprising the gate electrodes 44, one or more barrier and/or work-function tuning layers 43, and gate dielectric layer 42 may therefore be formed as illustrated in FIG. 8A-C. It is noted that the one or more dielectric layers 36 may experience some loss due to the planarization process.

Figure 9A:
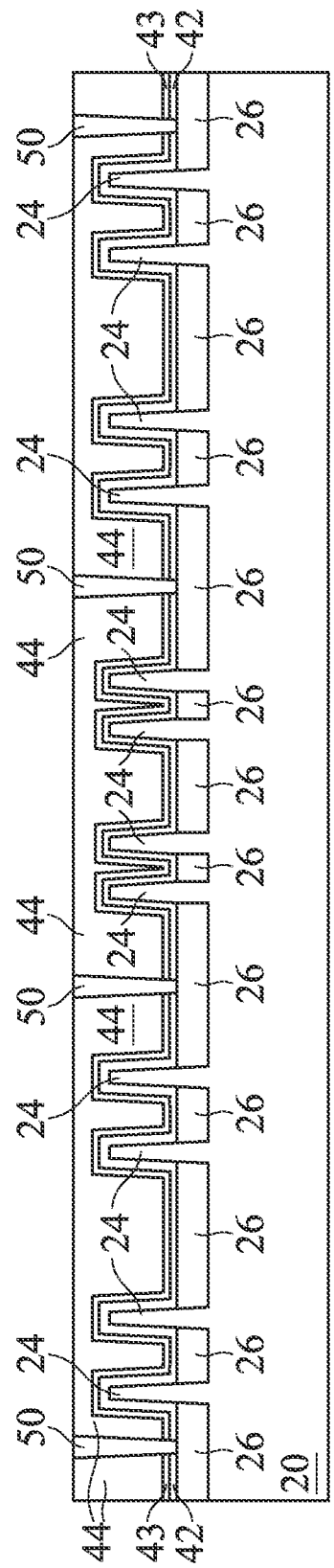
Figure 9B:
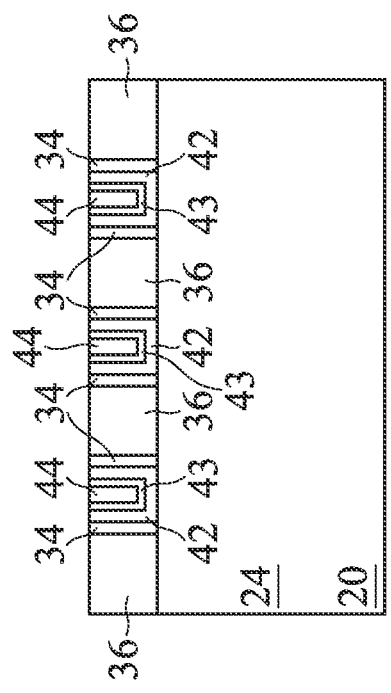
Figure 9C:
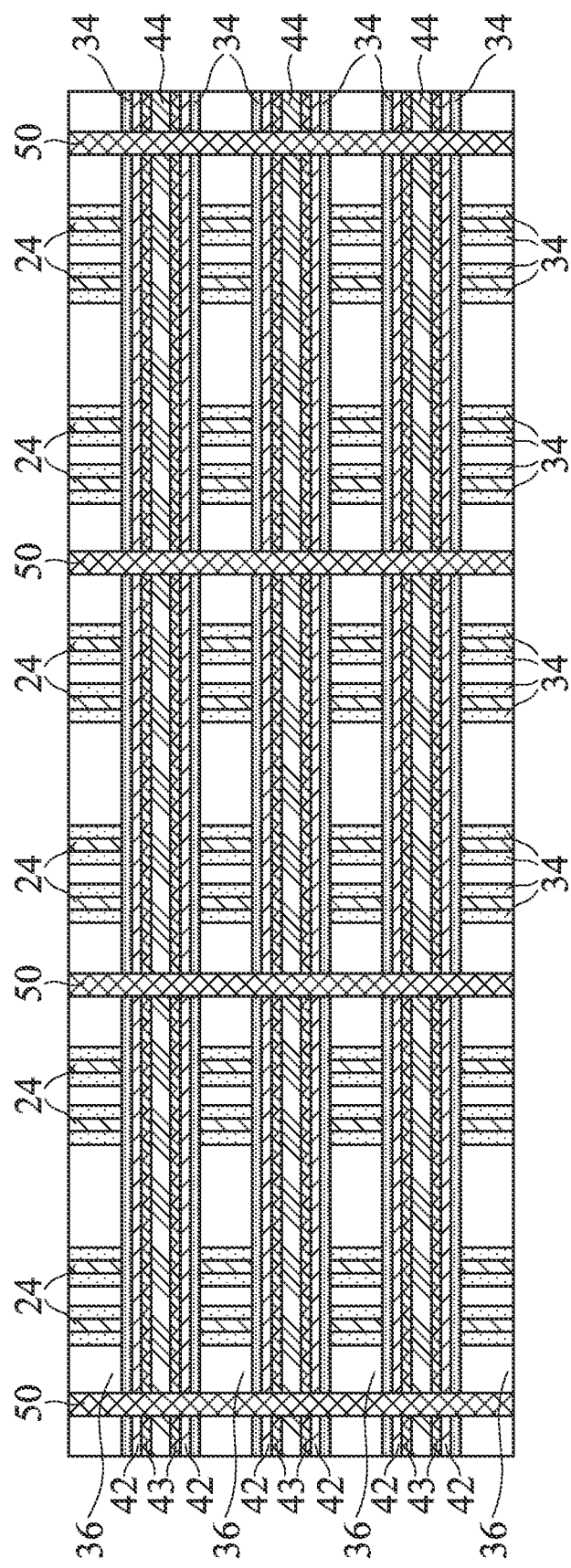

FIGS. 9A, 9B, and 9C illustrate the cutting of the replacement gate structures. The cutting of the replacement gate structures forms gate cut-fill structures 50 that extend laterally perpendicularly to the replacement gate structures and dissect the replacement gate structures. As indicated below, in some examples, the gate cut-fill structure 50 is an insulating material, and hence, portions of a replacement gate structure that were integral before the cutting of the replacement gate structure can be made to be electrically isolated sections from each other because of the gate cut-fill structure 50.

In some examples, a mask (e.g., a hard mask) is used to cut the replacement gate structures. For example, one or more mask layers are deposited over the replacement gate structures, the gate spacers 34, and the one or more dielectric layers 36, and the one or more mask layers are then patterned into the mask. In some examples, the one or more mask layers may include or be silicon nitride, silicon oxynitride, silicon carbide, silicon carbon nitride, the like, or a combination thereof, and may be deposited by CVD, PVD, ALD, or another deposition technique. The one or more mask layers may be patterned using photolithography and etching processes, as previously described. The mask can have openings extending in a direction laterally perpendicular to and intersecting the replacement gate structures.

Using the mask, the replacement gate structures, gate spacers 34, and one or more dielectric layers 36 may be etched such that trenches are formed cutting the replacement gate structures. The trenches can extend to a depth to and/or into the corresponding isolation regions 26, e.g., through the gate electrodes 44, one or more barrier and/or work-function tuning layers 43, and gate dielectric layer 42. The etch process may include a RIE, NBE, ICP etch, the like, or a combination thereof. The etching may be anisotropic. An insulating material for the gate cut-fill structures 50 is deposited in the trenches that cut the replacement gate structures. In some examples, each of the gate cut-fill structures 50 may be a single insulating material, and in other examples, the gate cut-fill structures 50 may include multiple different insulating materials, such as in a multi-layered configuration. In some examples, the insulating material may include or be silicon oxide, silicon nitride, silicon oxynitride, silicon carbide, silicon carbon nitride, the like, or a combination thereof, and may be deposited by CVD, PVD, ALD, or another deposition technique. Portions of the insulating material for the gate cut-fill structures 50 and the mask above the top surface of the one or more dielectric layers 36 are removed. For example, a planarization process, like a CMP, may remove the portions of the insulating material for the gate cut-fill structures 50 and the mask the top surface of the one or more dielectric layers 36, and top surfaces of the gate cut-fill structures 50 may be formed coplanar with the top surface of the one or more dielectric layers 36. It is noted that the replacement gate structures and one or more dielectric layers 36 may experience some loss due to the planarization process. The gate cut-fill structures 50 therefore electrically isolate sections of the replacement gate structures that were cut from each other. As illustrated in FIG. 9A, with the replacement gate structures being cut after the replacement gate structures are formed (e.g., deposited), the gate dielectric layer 42 and/or one or more barrier and/or work-function tuning layers 43 do not extend vertically along a sidewall of the gate cut-fill structures 50. Although the gate cut-fill structures 50 are illustrated in FIG. 9A as having a positive taper profile (e.g., sidewalls of components abutting the gate cut-fill structures 50 have angles with the bottom surfaces of the components adjoining the sidewalls is less than 90 degrees interior to those components, respectively), the gate cut-fill structures 50 may have a vertical profile (e.g., angels that are 90 degrees) or a re-entrant profile (e.g., angles that are greater than 90 degrees). The etching to form the trenches in which the gate cut-fill structures 50 are formed may cause such profiles to be formed.

Figure 10A:
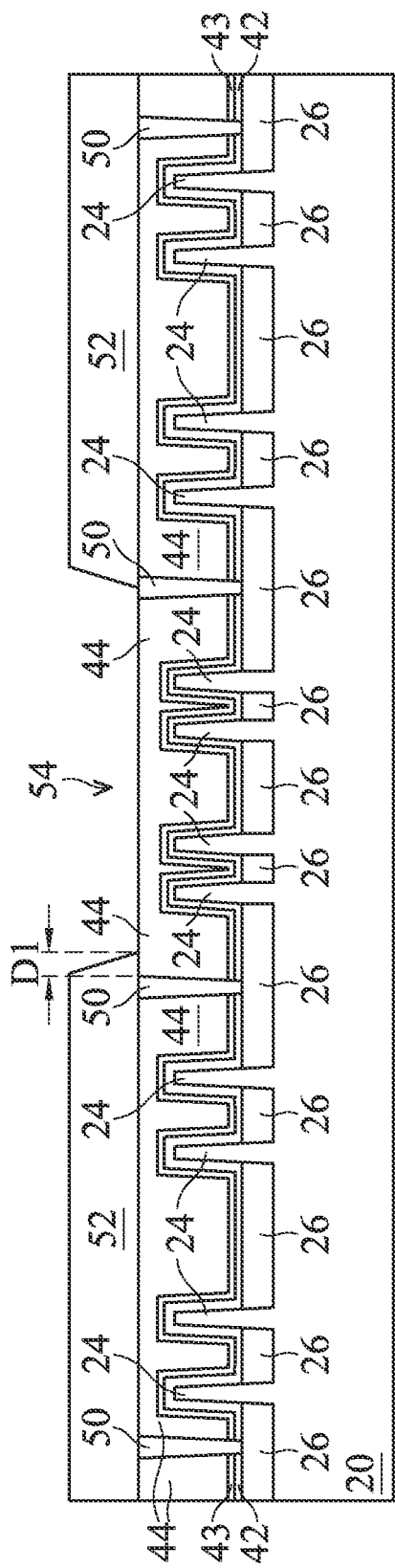
Figure 10B:
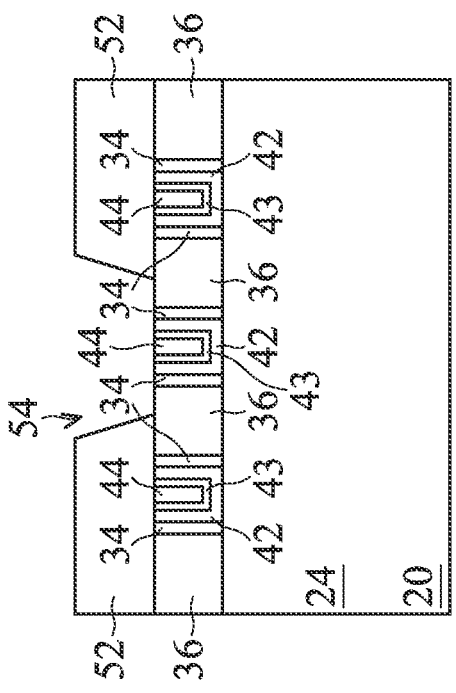
Figure 10C:
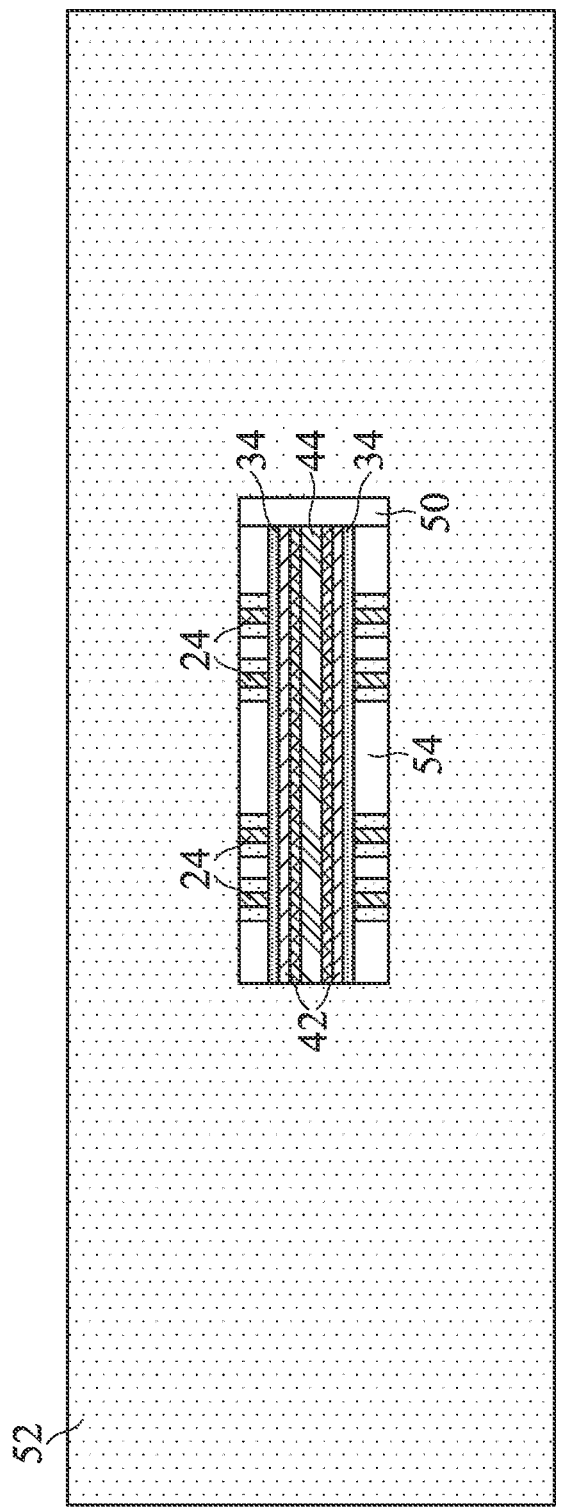

FIGS. 10A, 10B, and 10C illustrate the formation of a mask 52 with cut opening 54 used for cutting fins 24. For example, one or more mask layers are deposited over the replacement gate structures, the gate spacers 34, the one or more dielectric layers 36, and the gate cut-fill structure 50, and the one or more mask layers are then patterned into the mask. In some examples, the one or more mask layers may include or be silicon nitride, silicon oxynitride, silicon carbide, silicon carbon nitride, the like, or a combination thereof, and may be deposited by CVD, PVD, ALD, or another deposition technique. The one or more mask layers are patterned to have the cut opening 54 to thereby form the mask 52. The one or more mask layers may be patterned using photolithography and etching processes, as previously described. The cut opening 54 exposes at least a section of a replacement gate structure between a pair of gate cut-fill structures 50, which section of the replacement gate structure will be removed. As will become apparent subsequently, the removal of the section of the replacement gate structure is generally self-aligned, and processing may tolerate some misalignment between the cut opening 54 through the mask 52 and the gate cut-fill structures 50 on opposing sides of the section of the replacement gate structure to be removed. As illustrated in FIG. 10A, the cut opening 54 overhangs a gate cut-fill structure 50 by a misalignment dimension D1. Further, as shown in FIG. 10B, the cut opening 54 may, in some instances, not be aligned with the section of the replacement gate structure to be removed.

Figure 11A:
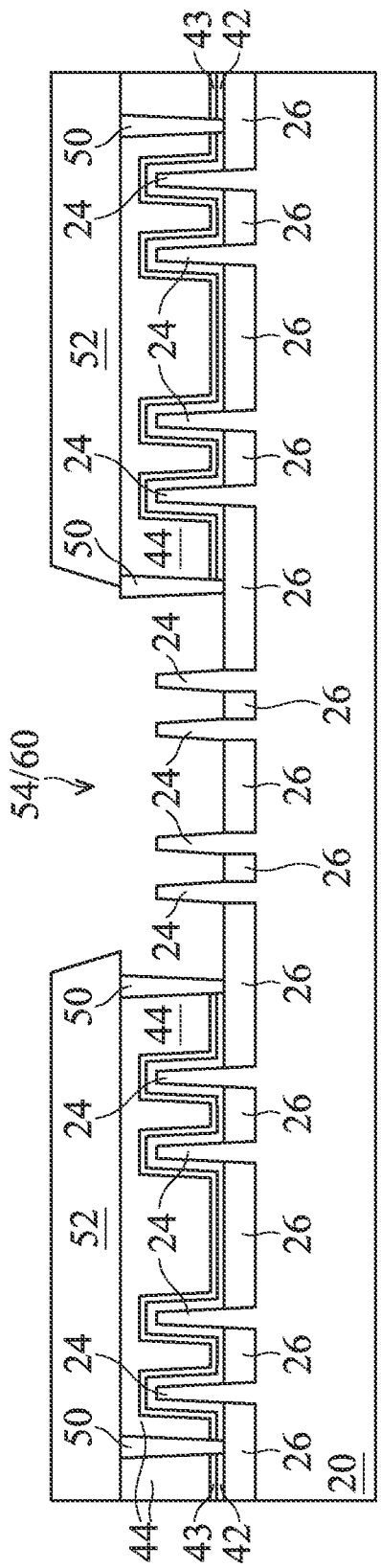
Figure 11B:
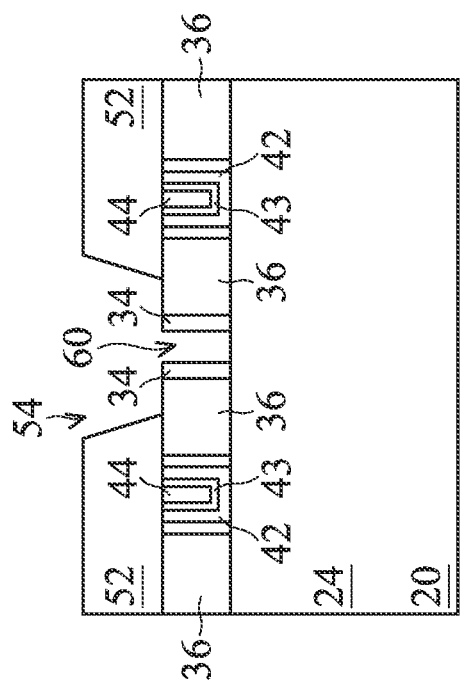
Figure 11C:
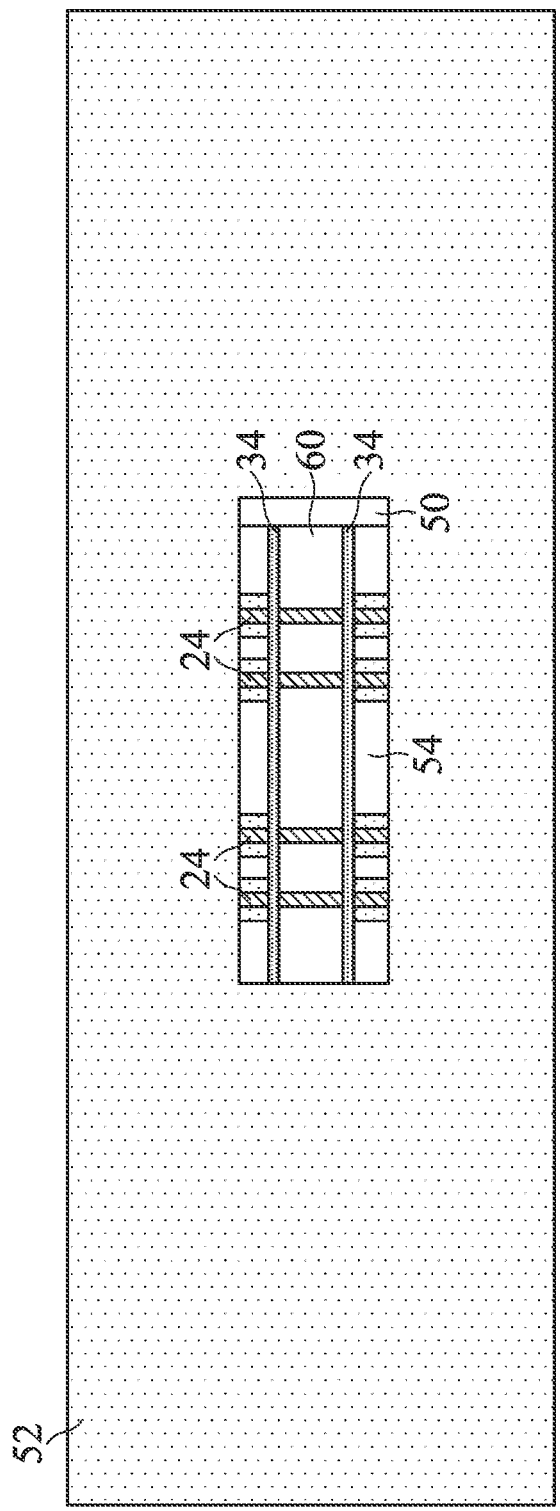

FIGS. 11A, 11B, and 11C illustrate the removal of the section of a replacement gate structure, at least a portion of which is exposed through the cut opening 54. The removal can be by one or more etch processes. The etch processes can be isotropic and selective of the materials of the gate electrode 44, one or more barrier and/or work-function tuning layers 43, and gate dielectric layer 42. For example, the one or more etch processes can be a wet etch process, such as including a sulfuring peroxide mix (SPM) (e.g., a mixture of $H_2SO_4$ and $H_2O_2$), a high temperature standard clean 1 (SC1) (e.g., a mixture of $NH_4OH$, $H_2O_2$, and $H_2O$), or another etch process. With an isotropic etch selective to the materials of the gate electrode 44, one or more barrier and/or work-function tuning layers 43, and gate dielectric layer 42, the section of the replacement gate structure that has at least a portion exposed through the cut opening 54 can be removed, even portions that may be underlying the mask 52 due to misalignment. Further, as illustrated, because the etch is selective to the materials of the gate electrode 44, one or more barrier and/or work-function tuning layers 43, and gate dielectric layer 42, the etch does not remove any exposed portions of the one or more dielectric layers 36, gate spacers 34, and gate cut-fill structures 50. The removal of the section of the replacement gate structure forms an opening 60 between the gate spacers 34 and gate cut-fill structures 50 along the section of the replacement gate structure that was removed.

Figure 12A:
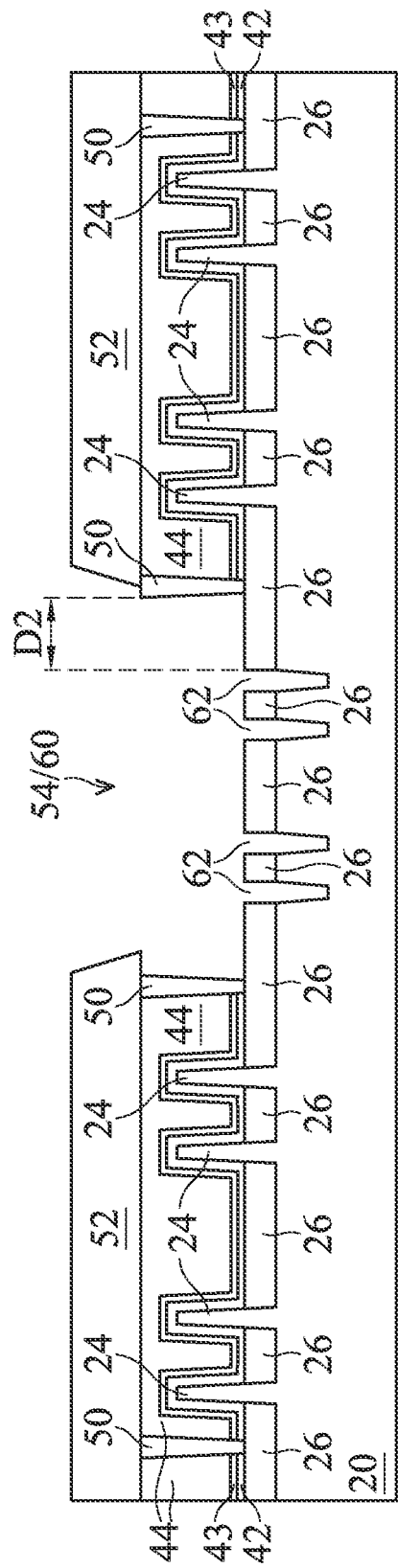
Figure 12B:
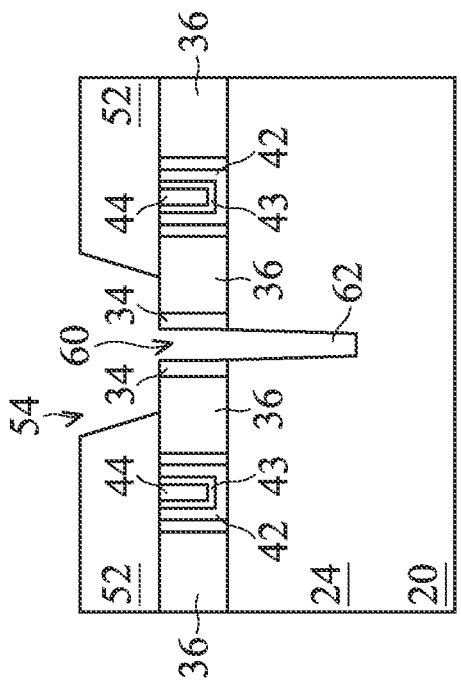
Figure 12C:
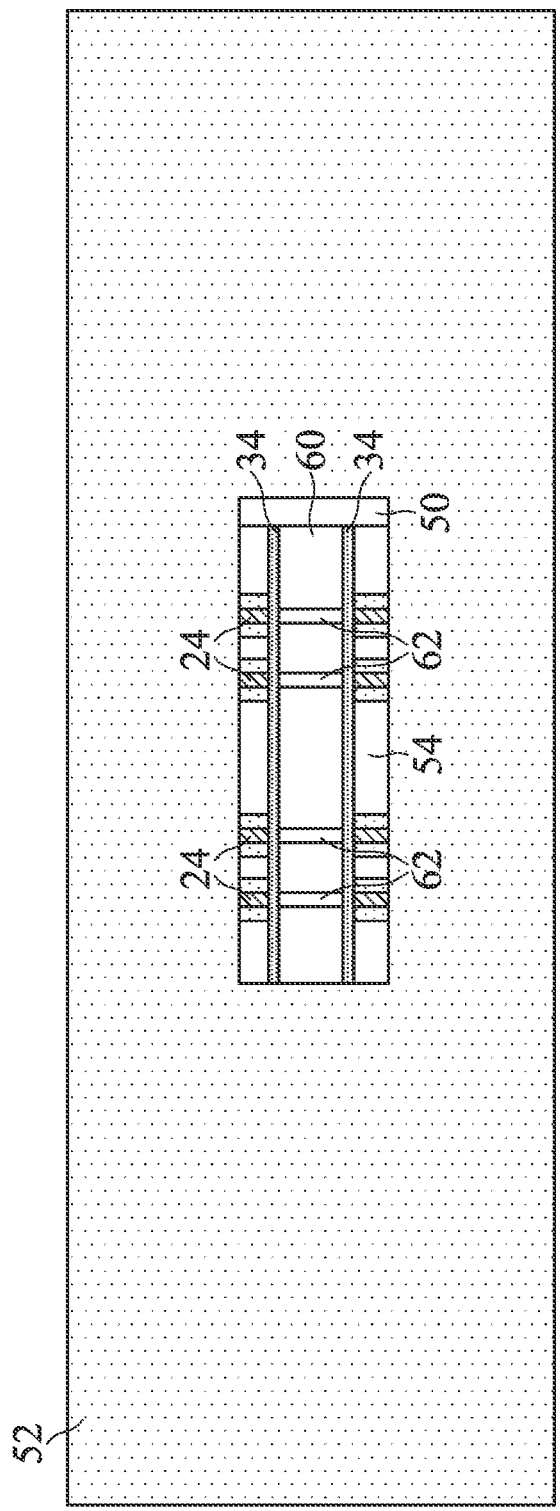

FIGS. 12A, 12B, and 12C illustrate the cutting of fins 24 exposed through the cut opening 54 through the mask 52 and the opening 60 where the section of the replacement gate structure was removed. The cutting of the fins 24 removes portions of the fins 24 exposed through the openings 54 and 60 at least to a level of the top surface of the neighboring isolation regions 26, and can further remove portions of the fins 24 between those isolation regions 26 and portions of the semiconductor substrate 20 below the isolation regions 26 to form recesses 62 in the semiconductor substrate 20. The cutting of the fins 24 may be by using an etch process. The etch process may be selective to the materials of the fins 24 and semiconductor substrate 20. The etch process may include a RIE, NBE, ICP etch, the like, or a combination thereof. The etching may be anisotropic. It is noted that the gate spacers 34, one or more dielectric layers 36, and/or isolation regions 26 exposed by the cut opening 54 and/or opening 60 may experience some loss during the etch process.

In some examples, the widths of the gate cut-fill structures 50 (e.g., illustrated in FIG. 12A) may be smaller than what may be formed by other processes. This can lead to a larger distance D2 between a gate cut-fill structure 50 and a nearest recess 62 formed by cutting the fins 24. A larger distance D2 can result in reduced under-cutting or under-etching of, e.g., the semiconductor substrate 20 under the gate cut-fill structure 50 when forming the recesses 62.

Figure 13A:
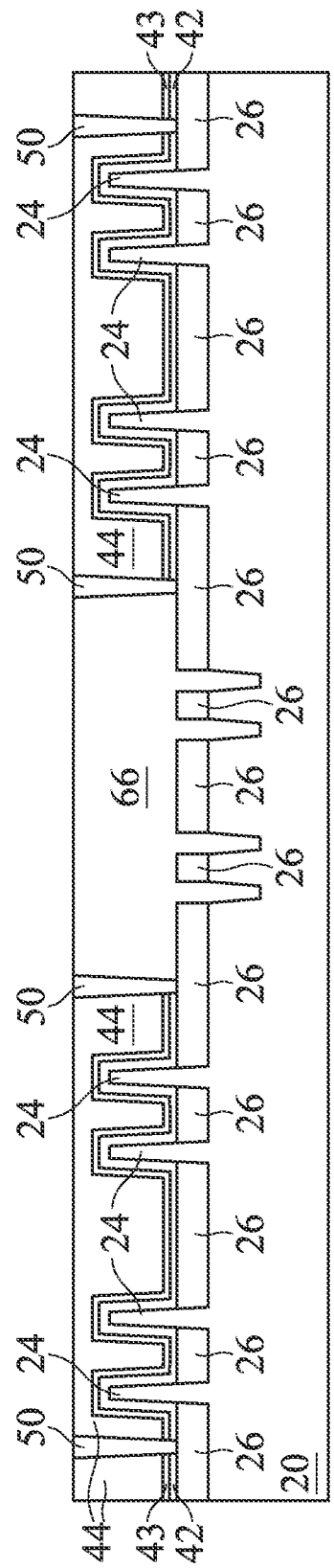
Figure 13B:
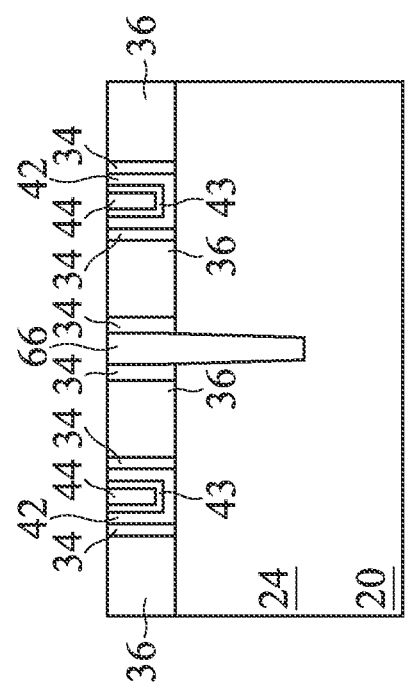
Figure 13C:
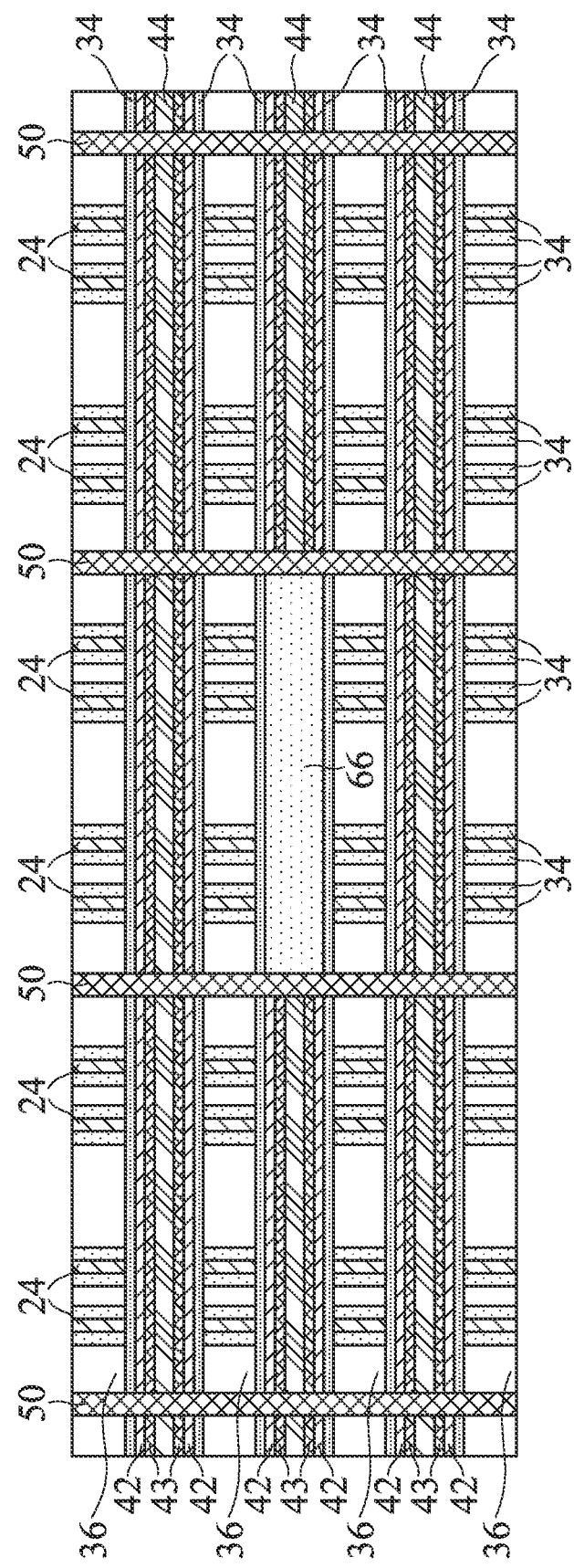

FIGS. 13A, 13B, and 13C illustrate the formation of a fill material 66 in the opening 60 where the section of the replacement gate structure was removed and in the recesses 62. The fill material 66 may be an insulating material. In some examples, fill material 66 may be a single insulating material, and in other examples, fill material 66 may include multiple different insulating materials, such as in a multi-layered configuration. The fill material 66 may include or be silicon oxide, silicon nitride, silicon oxynitride, silicon carbide, silicon carbon nitride, the like, or a combination thereof, and may be deposited by CVD, PVD, ALD, or another deposition technique. Portions of the fill material 66 above the top surface of the one or more dielectric layers 36 and the mask 52 are removed. For example, a planarization process, like a CMP, may remove the portions of the fill material 66 above the top surface of the one or more dielectric layers 36 and remove the mask 52, and top surfaces of the fill material 66 may be formed coplanar with the top surface of the one or more dielectric layers 36, gate cut-fill structures 50, etc. The fill material 66 therefore electrically isolates sections of the fins 24 that were cut from each other. It is noted that the replacement gate structures, gate spacers 34, one or more dielectric layers 36, and gate cut-fill structures 50 may experience some loss due to the planarization process.

Figure 14A:
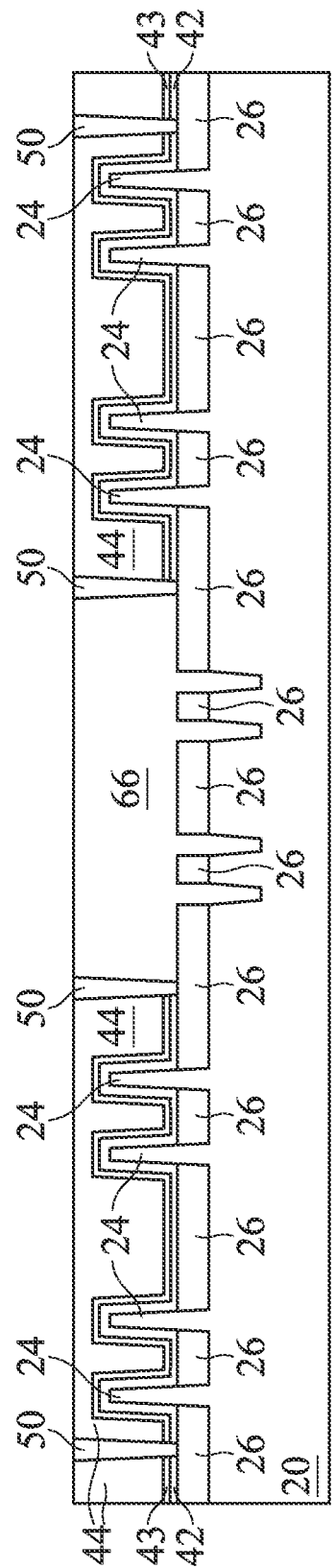
Figure 14B:
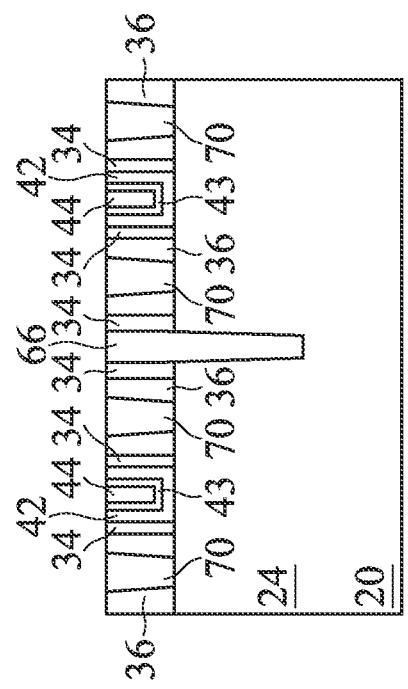
Figure 14C:
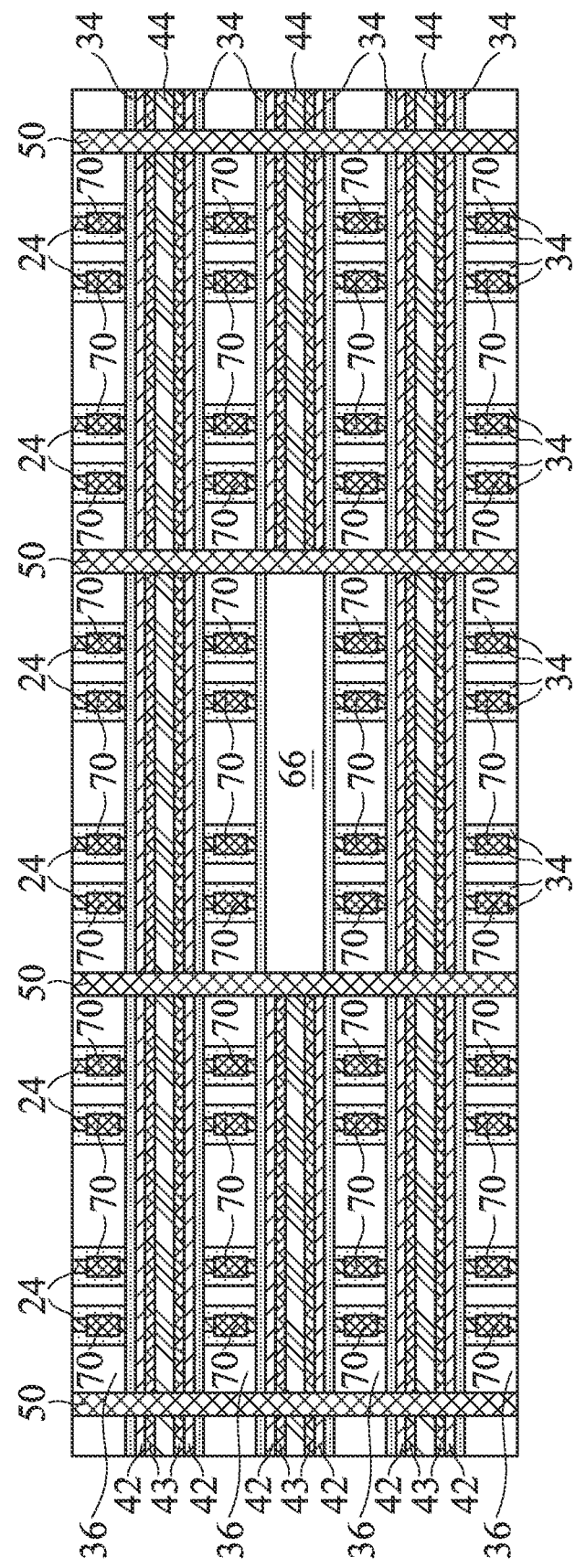

FIGS. 14A, 14B, and 14C illustrate the formation of conductive features 70, such as including contacts, can be formed through the one or more dielectric layers 36 to source/drain regions 35 of the fins 24. For example, openings may be formed through the one or more dielectric layers 36 to the source/drain regions 35 to expose at least respective portions of the source/drain regions 35. The openings may be formed using, for example, appropriate photolithography and etching processes. A metal layer can be conformally deposited in the openings, such as on the source/drain regions 35, and a barrier layer can be conformally deposited on the metal layer, for example. The metal layer may be or comprise, for example, titanium, cobalt, nickel, the like or a combination thereof, and may be deposited by ALD, CVD, or another deposition technique. The barrier layer may be or comprise titanium nitride, titanium oxide, tantalum nitride, tantalum oxide, the like, or a combination thereof, and may be deposited by ALD, CVD, or another deposition technique. Silicide regions may be formed on upper portions of the source/drain regions 35 by reacting upper portions of the source/drain regions 35 with the metal layer and/or barrier layer. An anneal can be performed to facilitate the reaction of the source/drain regions 35 with the metal layer and/or barrier layer.

Contacts filling the openings can then be formed. The contacts may be or comprise tungsten, copper, aluminum, gold, silver, alloys thereof, the like, or a combination thereof, and may be deposited by CVD, ALD, PVD, or another deposition technique. After the material of the contacts is deposited, excess material may be removed by using a planarization process, such as a CMP, for example. The planarization process may remove excess material of the contacts, barrier layer, and metal layer from above the top surface of the one or more dielectric layers 36. Hence, top surfaces of the contacts, barrier layer, metal layer, and one or more dielectric layers 36 may be coplanar. Accordingly, conductive features 70 including the contacts, barrier layer, metal layer, and/or silicide regions may be formed to the source/drain regions 35.

Figure 15A:
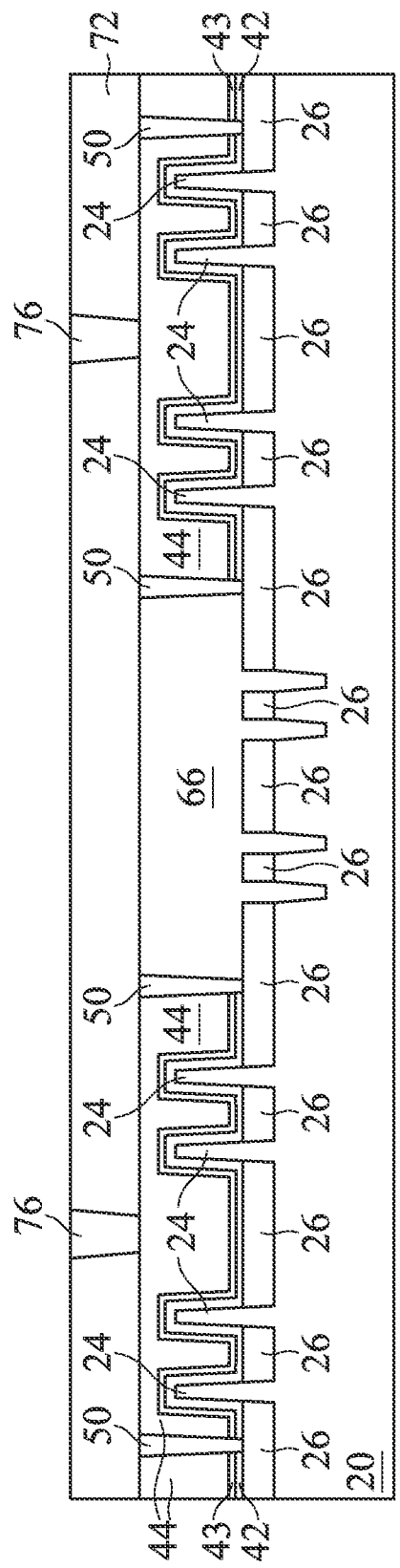
Figure 15B:
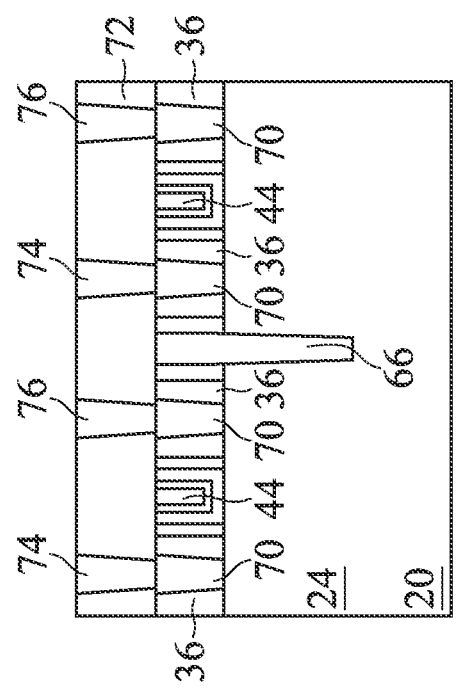
Figure 15C:
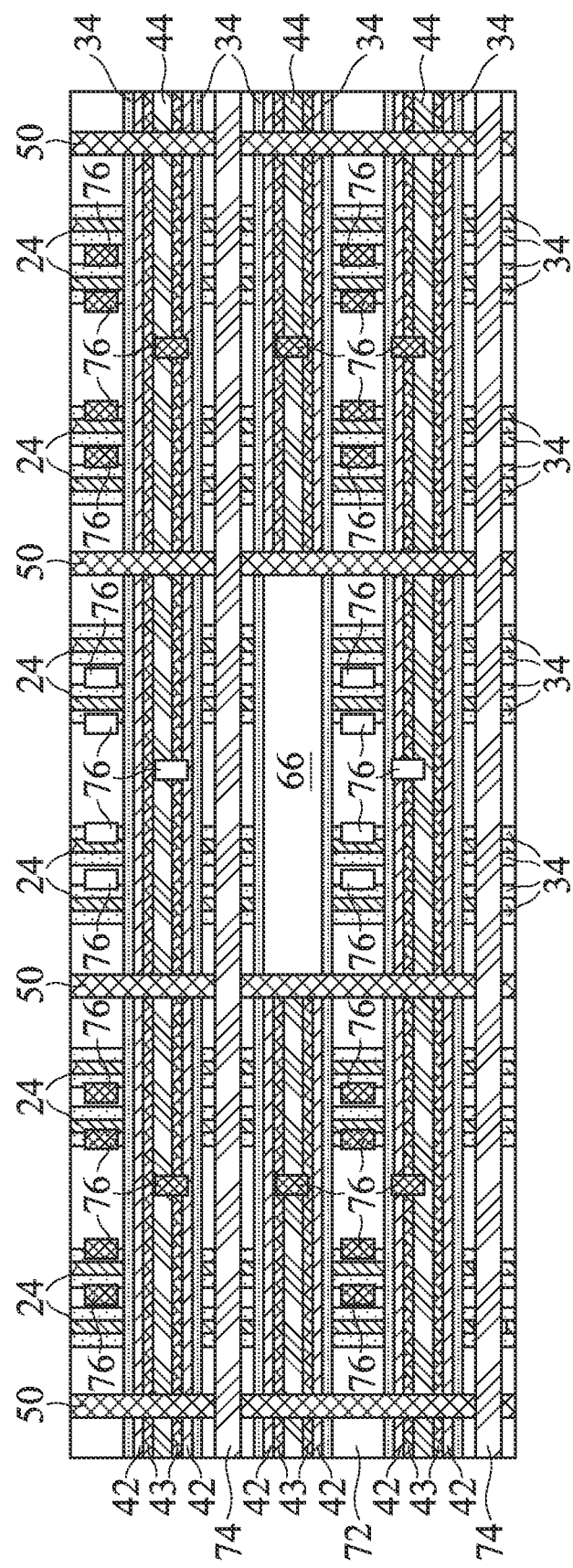

FIGS. 15A, 15B, and 15C illustrate the formation of one or more dielectric layers 72 and conductive features 74 and 76 in the one or more dielectric layers 72. The one or more dielectric layers 72 may include an etch stop layer (ESL) and an interlayer dielectric (ILD) or intermetal dielectric (IMD), for example. The etch stop layer may be deposited over the one or more dielectric layers 36, conductive features 70 in the one or more dielectric layers 36, gate cut-fill structures 50, fill material 66, etc. The etch stop layer may comprise or be silicon nitride, silicon carbon nitride, silicon carbon oxide, carbon nitride, the like, or a combination thereof, and may be deposited by CVD, PECVD, ALD, or another deposition technique. The interlayer dielectric or intermetal dielectric may comprise or be silicon dioxide, a low-k dielectric material, such as silicon oxynitride, PSG, BSG, BPSG, USG, FSG, OSG, $SiO_xC_y$, Spin-On-Glass, Spin-On-Polymers, silicon carbon material, a compound thereof, a composite thereof, the like, or a combination thereof. The interlayer dielectric or intermetal dielectric may be deposited by spin-on, CVD, FCVD, PECVD, PVD, or another deposition technique.

Recesses and/or openings can be formed in and/or through the one or more dielectric layers 72 where the conductive features 74 and 76 are to be formed. The one or more dielectric layers 72 may be patterned with the recesses and/or openings, for example, using photolithography and one or more etching processes. The conductive features 74 and 76 may then be formed in the recesses and/or openings. The conductive features 74 and 76 may include a barrier layer and conductive material formed on the barrier layer, for example. The barrier layer can be conformally deposited in the recesses and/or openings and over the one or more dielectric layers 72. The barrier layer may be or comprise titanium nitride, titanium oxide, tantalum nitride, tantalum oxide, the like, or a combination thereof, and may be deposited by ALD, CVD, or another deposition technique. The conductive material may be or comprise tungsten, copper, aluminum, gold, silver, alloys thereof, the like, or a combination thereof, and may be deposited by CVD, ALD, PVD, or another deposition technique. After the material of the conductive features 74 and 76 is deposited, excess material may be removed by using a planarization process, such as a CMP, for example. The planarization process may remove excess material of the conductive features 74 and 76 from above a top surface of the one or more dielectric layers 72. Hence, top surfaces of the conductive features 74 and 76 and the one or more dielectric layers 72 may be coplanar. The conductive features 74 and 76 may be or may be referred to as contacts, vias, and/or landing pads (e.g., conductive features 76); conductive lines (e.g., conductive features 74; etc. As illustrated, the conductive features 74 and 76 are formed to the conductive features 70 formed in the one or more dielectric layers 36 or replacement gate structures to electrically couple the source/drain regions 35 or the replacement gate structures, respectively. The layout of the conductive features in the figures is merely an example. A person having ordinary skill in the art will readily understand that a layout of conductive features can differ between different implementations.

Some embodiments may achieve advantages. As indicated previously, the removal of the section of the replacement gate structure can tolerate some misalignment of the cut opening 54 in the mask 52. This can permit larger and more robust critical dimension control in the process window for the removal of the section of the replacement gate structure. Further, in examples that implement stress engineering, cutting the fins after removing the dummy gate stacks and after forming the replacement gate structures on the fins can permit the fins to retain more stress in the fins (e.g., in channel regions of the fins) during processing (e.g., as opposed to the stress being significantly relaxed during processing). Performing processing in this order in some examples may facilitate stress engineering in devices, particularly, in devices at a technology node of 5 nm and smaller. By retaining more stress, devices formed with the fins can have increased performance.

An embodiment is a structure. The structure includes a substrate including a first fin, a second fin, and a first isolation region. The first fin and the second fin extend longitudinally parallel. The first isolation region is disposed between the first fin and the second fin. A first gate structure includes a conformal gate dielectric over the first fin and a gate electrode over the conformal gate dielectric. A first insulating fill structure abuts the first gate structure and extends vertically from a level of an upper surface of the first gate structure to at least a surface of the first isolation region. No portion of the conformal gate dielectric extends vertically between the first insulating fill structure and the gate electrode. A second insulating fill structure abuts the first insulating fill structure and an end sidewall of the second fin. The first insulating fill structure is disposed laterally between the first gate structure and the second insulating fill structure. A dielectric layer is over the first gate structure, the first insulating fill structure, and the second insulating fill structure.

Another embodiment is a method. A dummy gate structure is formed extending over a fin on a substrate. The dummy gate structure is replaced with a replacement gate structure. After replacing the dummy gate structure with the replacement gate structure, the fin is cut.

A further embodiment is a method. A first fin and a second fin are formed on a substrate. A first dummy gate structure is formed extending over the first fin and the second fin. A dielectric layer is formed over the first fin and the second fin. After forming the dielectric layer, the first dummy gate structure is replaced with a first replacement gate structure. The first replacement gate structure is cut in a region laterally between the first fin and the second fin. A first section of the first replacement gate structure is over the first fin, and a second section of the first replacement gate structure is over the second fin. The first section of the first replacement gate structure over the first fin is removed. The first fin is cut where the first section of the first replacement gate structure was removed.

A further embodiment is a structure. The structure includes a first fin and a second fin over a substrate. A first isolation region extends from a sidewall of the first fin to a first sidewall of the second fin. A first gate structure extends along the sidewall and a top surface of the first fin. A first insulating fill structure is over the first isolation region. A first sidewall of the first insulating fill structure is in physical contact with the first gate structure. The first insulating fill structure is interposed between the first fin and the second fin. A topmost surface of the first gate structure is level with a topmost surface of the first insulating fill structure. A second insulating fill structure is over the first isolation region and is in physical contact with a sidewall of the first insulating fill structure and a second sidewall of the second fin. The second sidewall of the second fin is different from the first sidewall of the second fin. The first insulating fill structure is interposed between the first gate structure and the second insulating fill structure. A topmost surface of the second insulating fill structure is level with the topmost surface of the first insulating fill structure.

A further embodiment is a structure. The structure includes a first fin and a second fin over a substrate. The first fin is parallel to the second fin. A first gate structure extends along opposing sidewalls and a top surface of the first fin. A second gate structure extends along opposing sidewalls and a top surface of the second fin. A first insulating fill structure is in physical contact with a sidewall of the first gate structure. A second insulating fill structure is in physical contact with a sidewall of the second gate structure. The sidewall of the second gate structure and the sidewall of the first gate structure face in opposite directions. The second insulating fill structure is parallel to the first insulating fill structure. A third insulating fill structure extends from the first insulating fill structure to the second insulating fill structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first fin and a second fin protruding from a substrate;
   forming a first gate structure extending over the first fin and the second fin;
   removing a first portion and a second portion of the first gate structure in a region laterally between the first fin and the second fin to form a first recess and a second recess, respectively, in the first gate structure;
   forming a first insulating material in the first recess and the second recess in the first gate structure to form a first gate cut structure and a second gate cut structure;
   removing the first gate structure between the first gate cut structure and the second gate cut structure to form a third recess; and
   forming a fill material in the third recess.

2. The method of claim 1, further comprising, prior to removing the first portion and the second portion:
   forming a dummy gate structure; and
   replacing the dummy gate structure with a replacement gate structure, the first gate structure being the replacement gate structure.

3. The method of claim 1, further comprising:
   forming a third fin protruding from the substrate, the third fin being between the first fin and the second fin, wherein the first recess is between the first fin and the third fin, wherein the second recess is between the second fin and the third fin.

4. The method of claim 3, further comprising, after removing the first gate structure between the first gate cut structure and the second gate cut structure, recessing the third fin.

5. The method of claim 4, wherein recessing the third fin completely removes the third fin in the third recess.

6. The method of claim 4, wherein recessing the third fin forms a fourth recess in the substrate.

7. The method of claim 6, wherein the fill material extends into the fourth recess in the substrate.

8. A method comprising:
   forming a fin on a substrate;
   forming a first isolation region and a second isolation region on the substrate, the fin being interposed between the first isolation region and the second isolation region;
   forming a first gate structure and first gate spacers along sidewalls and a topmost surface of the fin, the first gate structure extending along a top surface of the first isolation region and a top surface of the second isolation region;
   patterning the first gate structure to form a first trench and a second trench in the first gate structure to form a second gate structure, a third gate structure, and a fourth gate structure, the first trench being between the second gate structure and the third gate structure, the second trench being between the third gate structure and the fourth gate structure, the first trench exposing the first isolation region and the second trench exposing the second isolation region;
   filling the first trench and the second trench with a first insulating material to form a first insulating fill structure in the first trench and a second insulating fill structure in the second trench;

removing the third gate structure to expose a first portion of the fin, wherein the first gate spacers remain over the fin;

removing the first portion of the fin to form a recess, the recess extending between the first isolation region and the second isolation region; and filling the recess with an insulating material to form an insulating fill structure.

9. The method of claim 8, wherein the recess extends into the substrate.

10. The method of claim 8, wherein the insulating fill structure contacts the first gate spacers.

11. The method of claim 8, wherein an upper surface of the insulating fill structure is level with an upper surface of the second gate structure, an upper surface of the fourth gate structure, and an upper surface of the first insulating fill structure.

12. The method of claim 8, wherein the first trench and the second trench extend through the first gate spacers.

13. The method of claim 8, wherein the first gate structure comprises a metal gate electrode.

14. The method of claim 8, wherein the insulating fill structure contacts a sidewall of the substrate.

15. A method comprising:

forming a first fin, a second fin, and a third fin protruding from a substrate;

forming a first gate structure and gate spacers, the first gate structure extending over the first fin and the second fin, the gate spacers extending along sidewalls of the first gate structure;

removing a first portion and a second portion of the first gate structure to form a first recess and a second recess, respectively, in the first gate structure, the first portion of the first gate structure being in a region laterally between the first fin and the second fin, the second portion of the first gate structure being in a region laterally between the second fin and the third fin;

forming a first insulating material in the first recess and the second recess in the first gate structure to form a first gate cut structure and a second gate cut structure;

removing the first gate structure between the first gate cut structure and the second gate cut structure to form a third recess, the third recess exposing the second fin;

recessing the second fin; and forming a fill material in the third recess.

16. The method of claim 15, wherein removing the first portion and the second portion of the first gate structure removes a first portion and a second portion of the gate spacers such that the first recess and the second recess extend through the gate spacers, wherein forming the first insulating material fills the first recess and the second recess in the gate spacers.

17. The method of claim 15, further comprising:

forming an isolation region over the substrate between the first fin and the second fin, and between the second fin and the third fin, wherein the first gate cut structure and the second gate cut structure contact an upper surface of the isolation region.

18. The method of claim 17, wherein recessing the second fin forms a fourth recess, wherein the fourth recess exposes a sidewall of the isolation region.

19. The method of claim 18, wherein the fourth recess exposes a sidewall of the substrate.

20. The method of claim 15, wherein the fill material contacts the gate spacers.

* * * * *